United States Patent
Brewer et al.

(10) Patent No.: US 8,395,928 B2
(45) Date of Patent: Mar. 12, 2013

(54) THRESHOLD DEVICE FOR A MEMORY ARRAY

(75) Inventors: Julie Casperson Brewer, Santa Clara, CA (US); Christophe Chevallier, Palo Alto, CA (US); Wayne Kinney, Emmett, CA (US); Roy Lambertson, Los Altos, CA (US); Darrell Rinerson, Cupertino, CA (US); Lawrence Schloss, Palo Alto, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 13/206,460

(22) Filed: Aug. 9, 2011

(65) Prior Publication Data

US 2011/0291067 A1    Dec. 1, 2011

Related U.S. Application Data

(63) Continuation of application No. 11/881,473, filed on Jul. 26, 2007, now Pat. No. 7,995,371.

(51) Int. Cl.
    *G11C 11/36*    (2006.01)
(52) U.S. Cl. ............. 365/148; 257/4; 257/E45.003
(58) Field of Classification Search ............. 365/148; 257/43, 4, 2, E45.003, E29.002
    See application file for complete search history.

(56) References Cited

U.S. PATENT DOCUMENTS

| | | | |
|---|---|---|---|
| 6,753,561 B1 * | 6/2004 | Rinerson et al. | 257/295 |
| 7,633,790 B2 * | 12/2009 | Rinerson et al. | 365/148 |
| 7,742,323 B2 * | 6/2010 | Rinerson et al. | 365/129 |
| 2004/0160841 A1 * | 8/2004 | Rinerson et al. | 365/230.02 |
| 2004/0160849 A1 * | 8/2004 | Rinerson et al. | 365/230.06 |
| 2004/0161888 A1 * | 8/2004 | Rinerson et al. | 438/210 |
| 2006/0050598 A1 * | 3/2006 | Rinerson et al. | 365/232 |
| 2008/0094876 A1 * | 4/2008 | Siau et al. | 365/148 |

* cited by examiner

*Primary Examiner* — Douglas King
(74) *Attorney, Agent, or Firm* — Stolowitz Ford Cowger LLP

(57) ABSTRACT

A threshold device including a plurality of adjacent tunnel barrier layers that are in contact with one another and are made from a plurality of different dielectric materials is disclosed. A memory plug having first and second terminals includes, electrically in series with the first and second terminals, the threshold device and a memory element that stores data as a plurality of conductivity profiles. The threshold device is operative to impart a characteristic I-V curve that defines current flow through the memory element as a function of applied voltage across the terminals during data operations. The threshold device substantially reduces or eliminates current flow through half-selected or un-selected memory plugs and allows a sufficient magnitude of current to flow through memory plugs that are selected for read and write operations. The threshold device reduces or eliminates data disturb in half-selected memory plugs and increases S/N ratio during read operations.

27 Claims, 17 Drawing Sheets

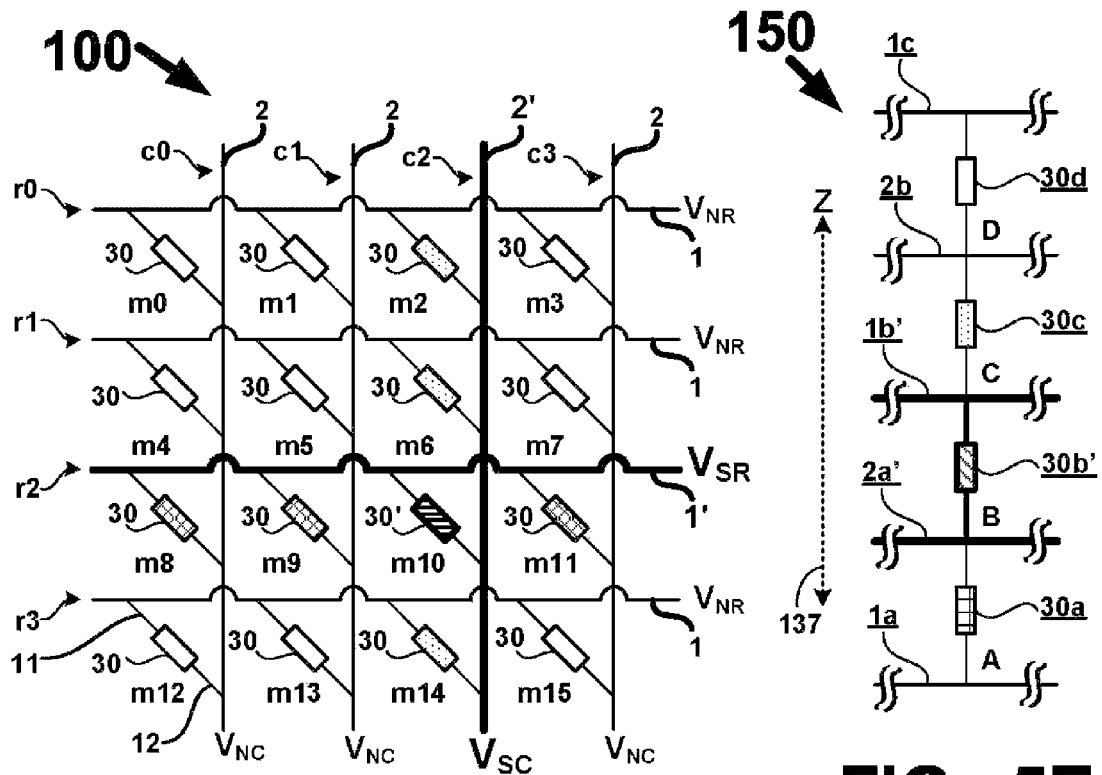
FIG. 5   FIG. 5E
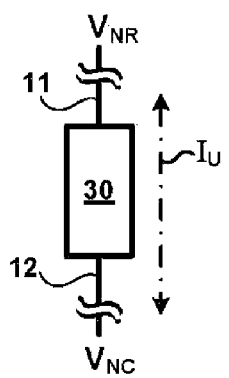 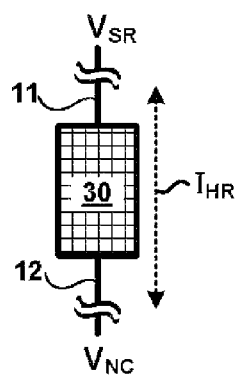 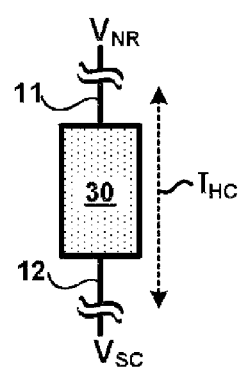 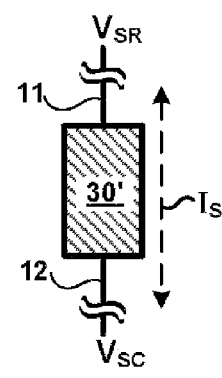
FIG. 5A   FIG. 5B   FIG. 5C   FIG. 5D

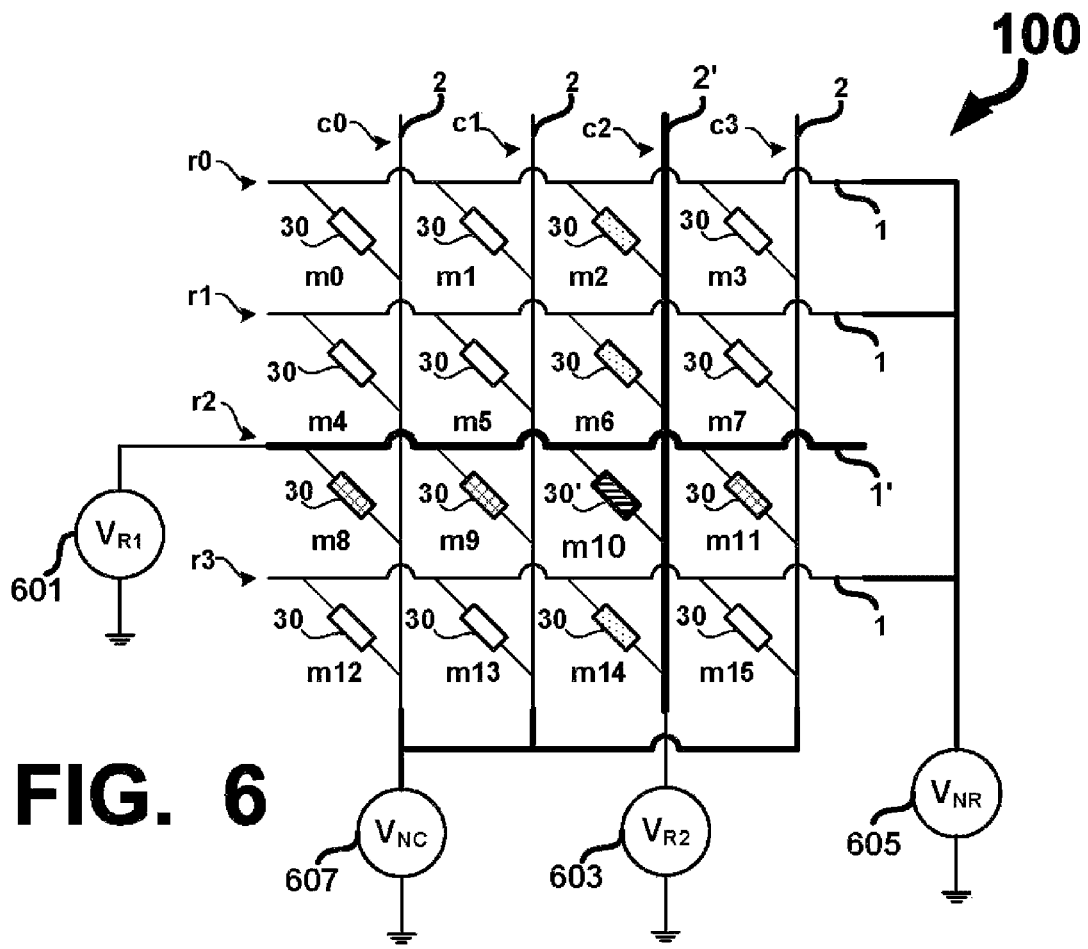
FIG. 6
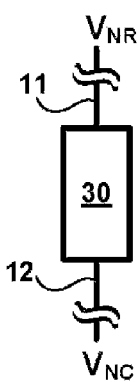 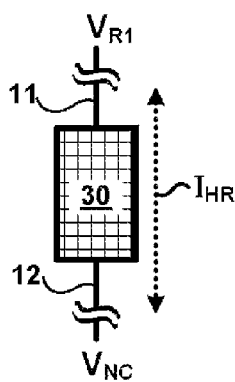 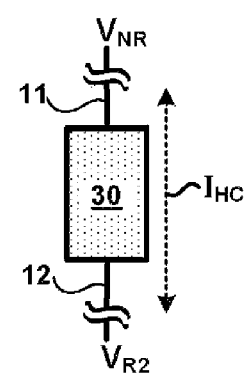 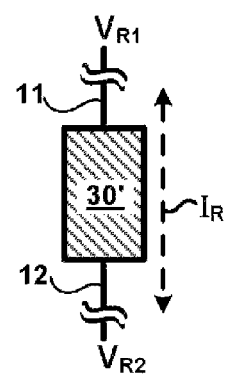
FIG. 6A    FIG. 6B    FIG. 6C    FIG. 6D

THRESHOLD DEVICE FOR A MEMORY ARRAY

FIELD OF THE INVENTION

This invention relates generally to semiconductors. More specifically, this invention relates to memory systems.

BACKGROUND OF THE INVENTION

A memory system may include sets of electrically conductive traces (e.g., word lines and bit lines) with a memory cell positioned at an intersection of a word line with a bit line. In some memory systems, a semiconductor device, such as a transistor, is positioned with and electrically coupled with the memory cell. The transistor includes a gate node (e.g., a MOSFET) or a base node (e.g., a bipolar transistor) coupled with a select line that controls access to the memory cell during data operations (e.g., read or write operations) to the memory cell. Furthermore, the transistor can be configured to require a range of threshold voltage potentials to be applied to the select line in order to read or write data to the memory cell. Accordingly, one range of threshold voltages can be used to read data from the memory cell and another range of threshold voltages can be used to write data to the memory cell. Typically, a MOSFET-based device is used for the transistor. The FET includes a source node coupled with the word or bit line, a drain node coupled with the memory cell, and a gate node coupled with the select line and operative to turn the transistor on when the select line is enabled and to turn the transistor off when the select line is disabled.

Consequently, three-terminals (i.e., the word, bit, and select lines) are required to access the memory cell for read or write operations. Accordingly, addressing the memory cell for a read or write operation requires selecting the appropriate word and bit lines for the memory cell and activating the select line of the transistor for the memory cell. However, the layout for three-terminal memory cells is not ideal and usually requires $8F^2$ for each memory cell in an array of memory cells, where F is the minimum feature size. As a result, an areal density for the memory system is decreased by the area required for each transistor and the routing resources required to implement the three-terminal connections to each memory cell in the array.

There are continuing efforts to improve memory systems.

BRIEF DESCRIPTION OF THE DRAWINGS

FIG. 5 is a schematic view depicting selection status of memory plugs in a two-terminal cross-point array;

FIG. 5A depicts an unselected memory plug;

FIGS. 5B and 5C depict half-selected memory plugs;

FIG. 5D depicts a selected memory plug;

FIG. 5E is a schematic view depicting selection status of memory plugs in one embodiment of a stacked two-terminal cross-point array;

FIG. 6 is a schematic view depicting one embodiment of a two-terminal cross-point memory array during a read operation;

FIG. 6A depicts an unselected memory plug during a read operation;

FIGS. 6B and 6C depict half-selected memory plugs during a read operation;

FIG. 6D depicts a selected memory plug during a read operation;

Figure 1:
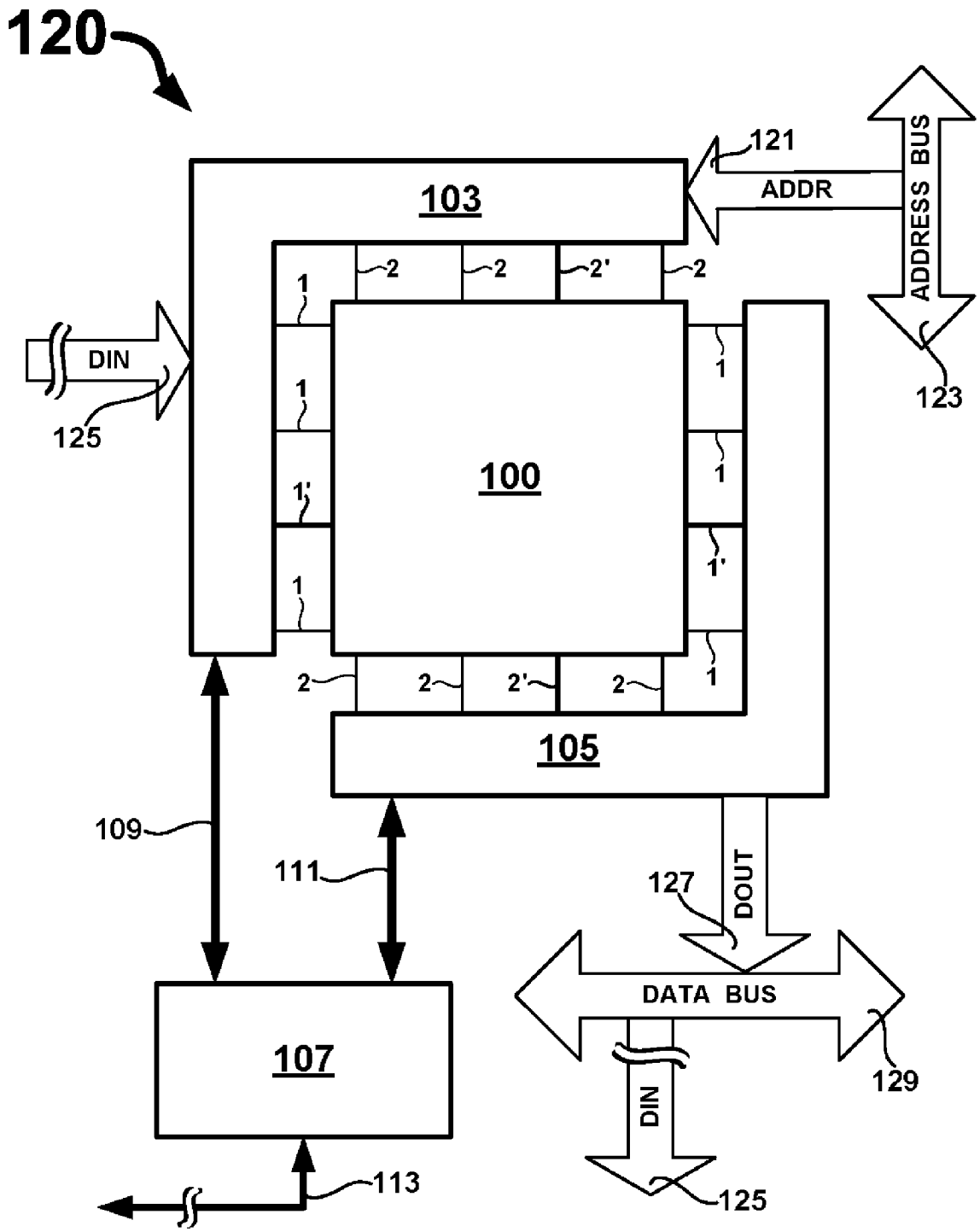
FIG. 1 depicts a memory system including a two-terminal cross-point array.

Although the previous Drawings depict various examples of the invention, the invention is not limited to those specific examples. Furthermore, the depictions are not necessarily to scale.

DETAILED DESCRIPTION

In the following detailed description and in the several figures of the drawings, like elements are identified with like reference numerals.

Memory System Architecture

In FIG. 1, an exemplary memory system 120 includes a two-terminal cross-point memory array 100 (array 100 hereinafter) including a plurality of first conductive traces 1, a plurality of second conductive traces 2, an address unit 103, and a sense unit 105. The address unit 103 receives an address ADDR, decodes the address, and based on the address, selects at least one of the plurality of first conductive traces (denoted as 1') and one of the plurality of second conductive traces (denoted as 2'). The address unit 103 applies select voltage potentials to the selected first and second conductive traces 1' and 2'. The address unit 103 also applies a non-select voltage potential to unselected traces 1 and 2. The sense unit 105 senses one or more currents flowing through one or more of the conductive traces. During a read operation to the array 100, current sensed by the sense unit 105 is indicative of stored data in a memory plug (not shown) positioned at an intersection of the selected first and second conductive traces 1' and 2'. A bus 121 coupled with an address bus 123 can be used to communicate the address ADDR to the address unit 103. The sense unit 105 processes the one or more currents and at least one additional signal to generate a data signal DOUT that is indicative of the stored data in the memory plug. In some embodiments, the sense unit 105 may sense current flowing through a plurality of memory plugs and processes those currents along with additional signals to generate a data signal DOUT for each of the plurality of memory plugs. A bus 127 communicates the data signal DOUT to a data bus 129. During a write operation to the array 100, the address unit 103 receives write data DIN to be written to a memory plug specified by the address ADDR. A bus 125 communicates the write data DIN from the data bus 129 to the address unit 103. The address unit 103 determines a magnitude and polarity of the select voltage potentials to be applied to the selected first and second conductive traces 1' and 2' based on the value of the write data DIN. For example, one magnitude and polarity can be used to write a logic "0" and a second magnitude and polarity can be used to write a logic "1". In other embodiments, the memory system 120 can include dedicated circuitry that is separate from the address unit 103 to generate the select potentials and to determine the magnitude and polarity of the select potentials.

One skilled in the art will appreciate that the memory system 120 and its components (e.g., 103 and 105) can be electrically coupled with and controlled by an external device (e.g., a microprocessor or a memory controller). Optionally, the memory system 120 can include at least one control unit 107 operative to coordinate and control operation of the address and sense units 103 and 105 and any other circuitry necessary for data operations (e.g., read and write operations) to the array 100. One or more signal lines 109 and 111 can electrically couple the control unit 107 with the address and sense units 103 and 105. The control unit 107 can be electrically coupled with an external system (e.g., a microprocessor or a memory controller) through one or more signal lines 113.

Figure 1A:
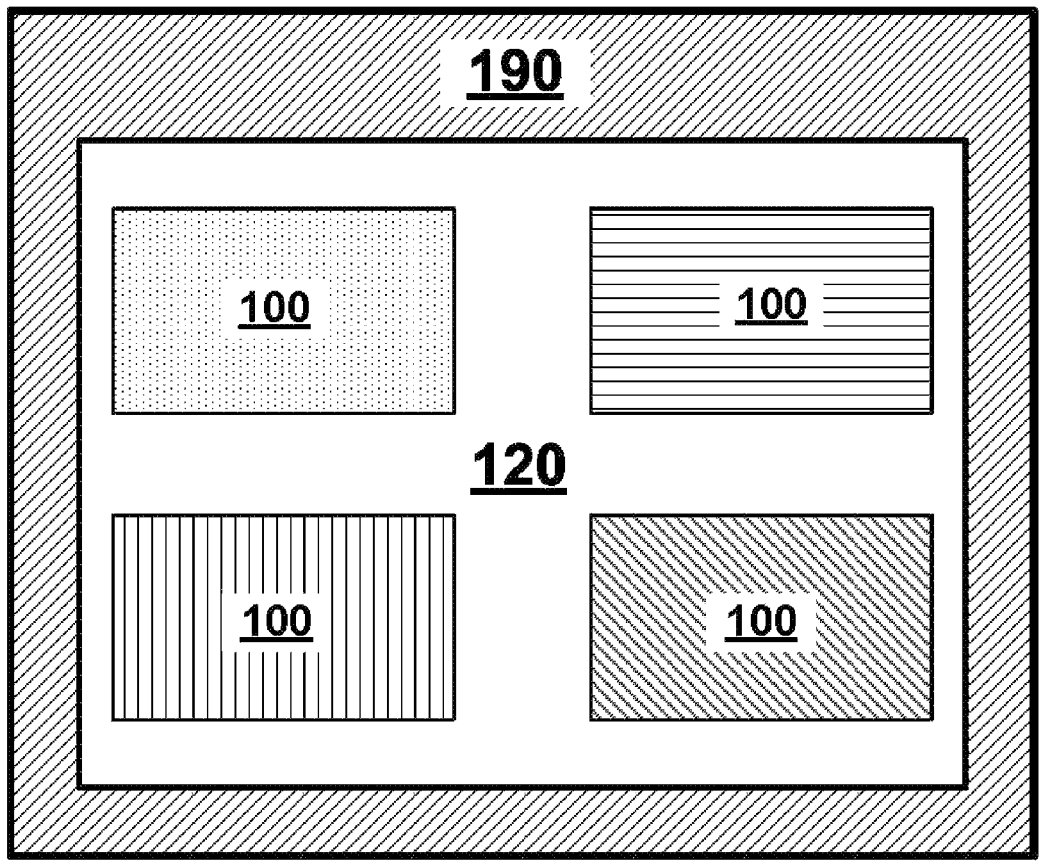
FIG. 1A is a top plan view depicting a memory system including a plurality of two-terminal cross-point arrays formed over a substrate including circuitry.

Turning to FIG. 1A, with the exception of the array 100, circuitry that implements the memory system 120 may be fabricated on a substrate 190 (e.g., a silicon Si wafer). The substrate 190 may also carry other circuitry and that circuitry may include circuits that communicate with the memory system 120. Although the memory system 120 is fabricated on the substrate 190, the portion of the memory system 120 comprising the array 100, is fabricated over the substrate 190 such that one or more of the arrays 100 can be positioned over the substrate 190 that carries the circuitry for the memory system 120. One or more levels of interconnect structure (not shown) electrically couple the arrays 100 with the circuitry on the substrate 190.

The architecture of the memory system 120 will be application dependent and the plurality of arrays 100 can be implemented in a variety of ways including but not limited to separate and independent arrays 100, arrays 100 configured into separate memory banks, arrays 100 configured as bit blocks, and stacked arrays. One skilled in the art will appreciate that when multiple arrays 100 are used, each array 100 can be controlled by its own dedicated memory system 120, one memory system 120 can control multiple arrays 100, or the memory system 120 can be configured so that each array 100 has its own dedicated address unit 103 and sense unit 105 that can be controlled by a single control unit 107.

In FIG. 1A, the memory system 120 includes four arrays 100 positioned over substrate 190 that includes active circuitry. The active circuitry includes the circuitry for the memory system 120. The arrays 100 can be individually accessed for read and write operations through memory mapping, can be configured as memory banks, or partitioned into bit blocks, for example.

Figure 1B:
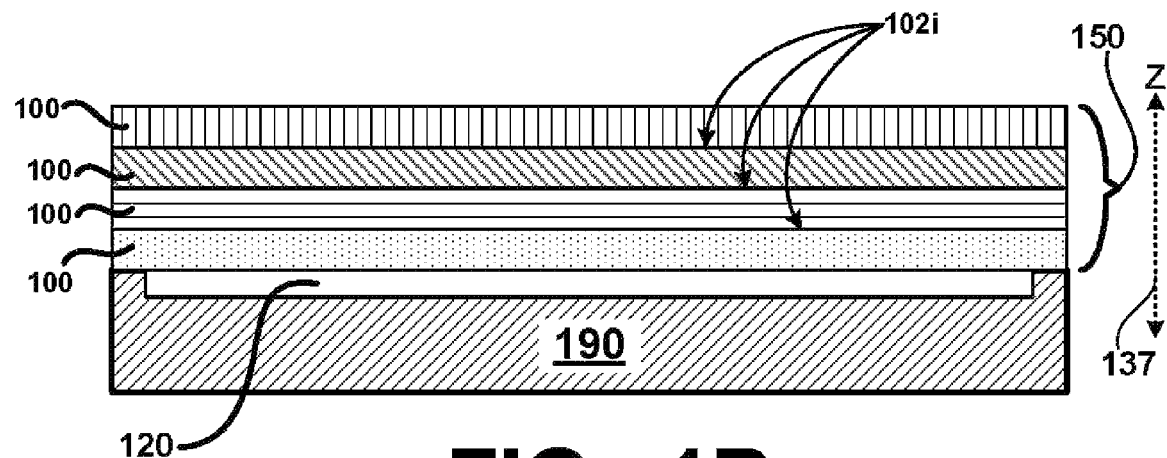
FIG. 1B is a cross-sectional view depicting a memory system including a plurality of stacked two-terminal cross-point arrays formed over a substrate including circuitry.

In FIG. 1B, the memory system 120 includes a stacked cross-point array 150 positioned over the substrate 190 that includes the circuitry for the memory system 120. The stacked cross-point array 150 includes four arrays 100 positioned one over the other (i.e., vertically stacked along a Z-axis 137) to form four layers or four levels of memory. The arrays 100 are fabricated one above the other, and in some embodiments, the arrays can share conductive traces 1 and 2 between adjacent layers. Alternatively, an interface 102*i* between adjacent arrays 100 can include a layer of material (e.g., a dielectric material) that electrically isolates the arrays 100 from one another such that conductive traces 1 and 2 are not shared between memory layers. The memory system 120 can include a plurality of stacked cross-point arrays 150. The configuration of the stacked cross-point array 150 will be application dependent. Possible configurations include but are not limited to memory banks, bit-blocks, and independently addressable arrays, for example.

Two-Terminal Cross-Point Array

Figure 1C:
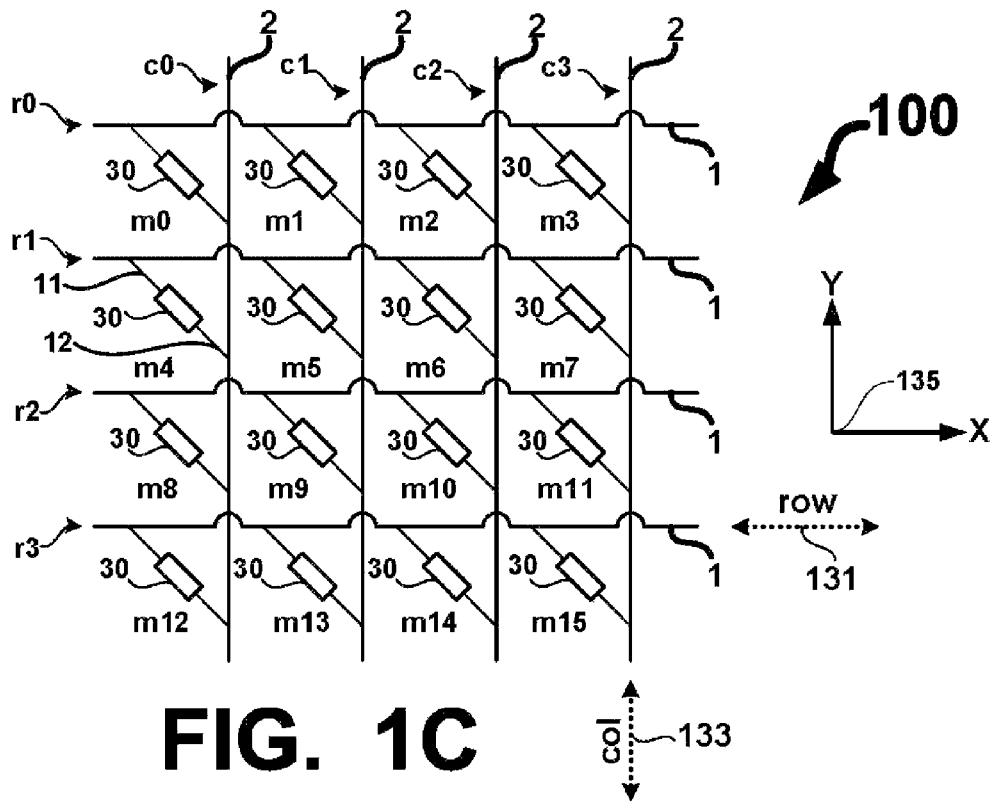
FIG. 1C is a schematic depicting a two-terminal cross-point array.

Reference is now made to FIG. 1C where the array 100 includes a plurality of first conductive traces 1 and a plurality of second conductive traces 2. The plurality of first conductive traces 1 are spaced apart from one another do not come into contact with one another other or with any of the plurality second conductive traces 2. Similarly, the plurality of second conductive traces 2 are spaced apart from one another and do not come into contact with one another or with any of the plurality of first conductive traces 1. Preferably, the plurality of first conductive traces 1 and the plurality of second conductive traces 2 are oriented substantially orthogonal to each other. Moreover, a memory plug 30 is positioned substantially at an intersection of one of the first conductive traces 1 with one of the second conductive traces 2. Each memory plug 30 includes a first terminal 11 that is electrically coupled with only one of the plurality of first conductive traces 1 and a second terminal 12 that is electrically coupled with only one of plurality of the second conductive traces 2. Therefore, in FIG. 1C the array 100 includes sixteen memory plugs 30 denoted as m0 through m15. For purposes of explanation, an X-Y axis 135 is depicted to illustrate that the plurality of first conductive traces 1 can be arranged in a row direction 131 that is aligned with a X-axis and the plurality of second conductive traces 2 can be arranged in a column direction 133 that is aligned with a Y-axis. Consequently, the array 100 includes four rows denoted as r0 through r3 and four columns denoted as c0 through c3.

Figure 1D:
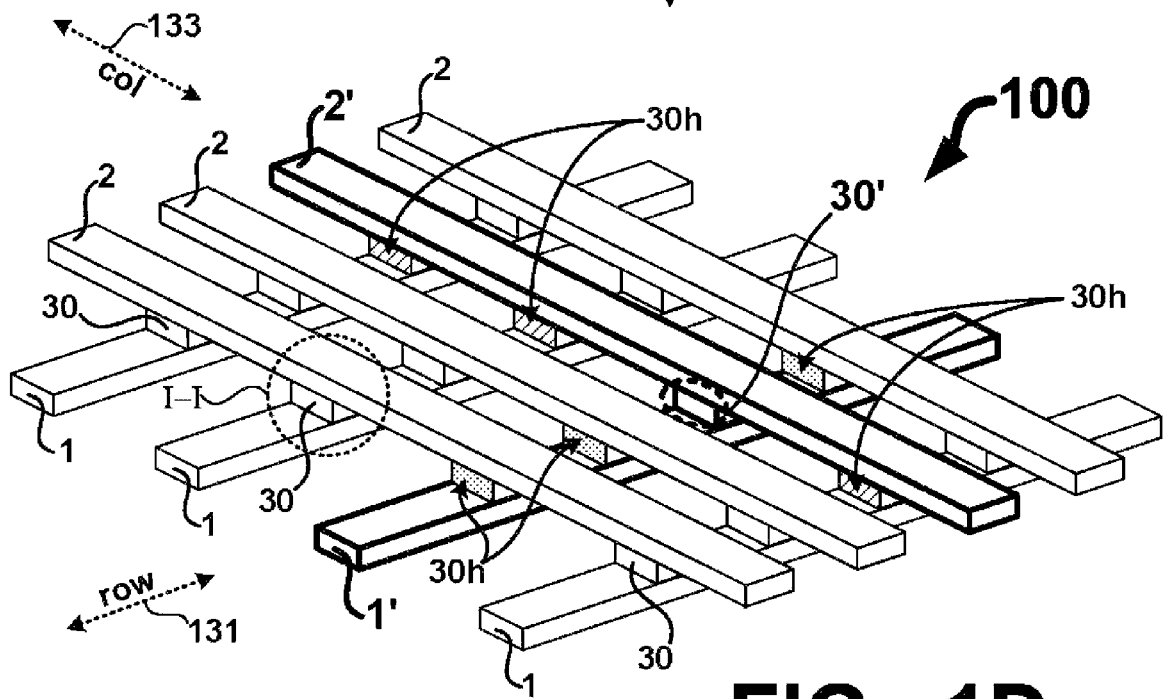
FIG. 1D is a profile view depicting a two-terminal cross-point array.

In FIG. 1D, a profile view depicts each memory plug 30 positioned at an intersection of one of the first conductive traces 1 with one of the second conductive traces 2. Each memory plug 30 can be selected for a data operation, such as a read operation or a write operation, by applying select voltage potentials to a unique pair of the first and second conductive traces 1 and 2 that cross the memory plug 30. Accordingly, selected first and second conductive traces are denoted as 1' and 2' respectively and a selected memory plug is denoted as 30'. Non-select voltage potentials are applied to the remainder of the first and second conductive traces 1 and 2 in the array 100. Consequently, during a data operation, memory plugs 30 in the same row or column as the selected memory plug 30' are half-selected memory plugs denoted as 30h because those memory plugs have one terminal electrically coupled with a conductive trace at the non-select voltage potential and the other terminal electrically coupled with a conductive trace at the select voltage potential. On the other hand, memory plugs 30 having both terminals electrically coupled with conductive traces at the non-select voltage potentials are un-selected memory plugs 30. Preferably, when there are no data operations to the array 100, the non-select voltage potential is applied to all of the conductive traces 1 and 2 so that the conductive traces do not float. One advantage to not allowing the conductive traces 1 and 2 to float is reduced power consumption as will be described in greater detail below.

Stacked Two-Terminal Cross-Point Arrays

Figure 1E:
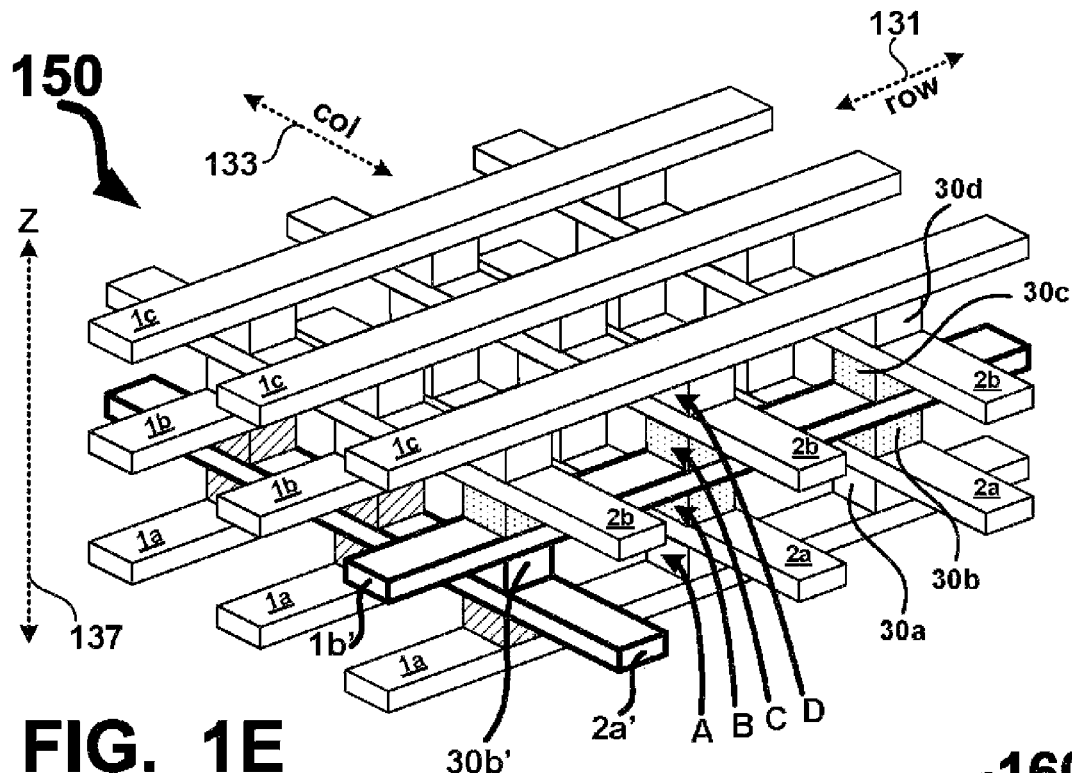
FIG. 1E is a profile view depicting one embodiment of a stacked two-terminal cross-point array.

Turning now to FIG. 1E, one embodiment of a stacked two-terminal cross-point memory array 150 (array 150 hereinafter) includes a plurality of memory layers denoted as A, B, C, and D that are vertically staked upon each other (i.e., along a Z-axis 137). Layer A including conductive traces 1*a* and 2*a* and memory plugs 30*a*, layer B including conductive traces 2*a* and 1*b* and memory plugs 30*b*, layer C including conductive traces 1*b* and 2*b* and memory plugs 30*c*, and layer D including conductive traces 2*b* and 1*c* and memory plugs 30*d*. To select a memory plug 30*b* in layer B for a data operation, select voltage potentials are applied to conductive traces 1*b*' and 2*a*' (depicted in heavy solid line) and non-select voltage potentials are applied to the remaining conductive traces in the array 150. As a result, memory plugs other than the selected memory plug 30*b*' that are coupled with the conductive traces 1*b*' and 2*a*' are half-selected memory plugs. Accordingly, other than the selected memory plug 30*b*', memory plugs that are positioned above and below selected conductive trace 2*a*' are half-selected memory plugs and memory plugs positioned above and below selected conductive trace 1*b*' are half-selected memory plugs. FIG. 1E depicts shared conductive array lines between adjacent memory layers. The conductive array lines are shared because memory plugs in adjacent memory layers are electrically coupled with the same conductive array lines. As one example, memory plugs 30*b* and 30*c* both share conductive traces 1*b* and memory plugs 30*a* and 30*b* share conductive traces 2*a*. Therefore, selecting a memory plug for a data operation in array 150 results in more half-selected and un-selected memory plugs than the configuration depicted in FIG. 1D. On the other hand, like the configuration depicted in FIG. 1D, memory plugs having both terminals (i.e., 11 and 12) electrically coupled with conductive traces at the non-select voltage potentials are un-selected memory plugs. The embodiment depicted has the advantage of reducing the number of conductive traces required to implement the array 150 because three levels of row conductors (1*a*, 1*b*, and 1*c*) and two levels of column conductors (2*a* and 2*b*) are required to access the memory plugs. However, the configuration depicted also creates some restrictions on data operations to multiple memory plugs 30 at the same time. The array 150 can be positioned over a substrate that carries active circuitry (e.g., components of system 120) that communicates with the memory layers through an interconnect structure (not shown).

Figure 1F:
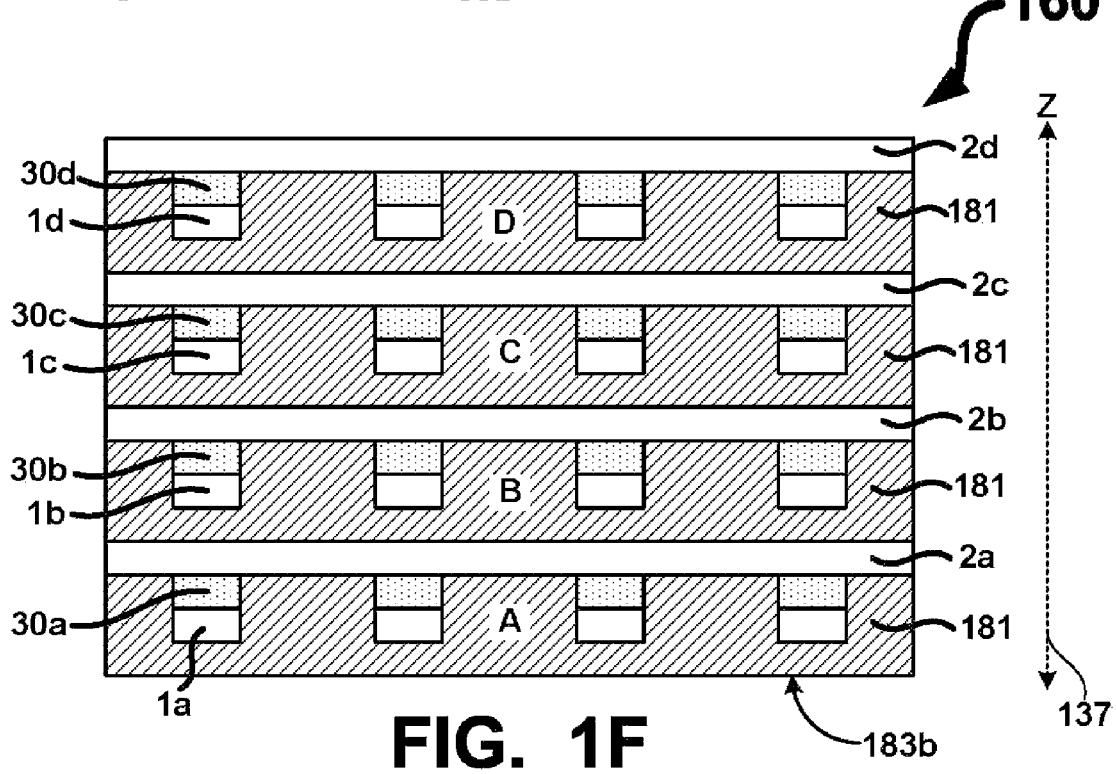
FIG. 1F is a cross-sectional view depicting another embodiment of a stacked two-terminal cross-point array.

Reference is now made to FIG. 1F, where a cross-sectional view of an alternative embodiment of a stacked two-terminal cross-point memory array 160 (array 160 hereinafter) includes a plurality of memory layers denoted as A, B, C, and D that are vertically stacked upon one another (e.g., along Z-axis 137). Layer A including first and second conductive traces 1*a* and 2*a* and memory plugs 30*a*, layer B including first and second conductive traces 1*b* and 2*b* and memory plugs 30*b*, layer C including first and second conductive traces 1*c* and 2*c* and memory plugs 30*c*, and layer D including first and second conductive traces 1*d* and 2*d* and memory plugs 30*d*. Each memory layer is separated by an electrically insulating material 181 (e.g., a dielectric material) such that memory plugs 30 in a memory layer do not share conductive traces with memory plugs 30 in adjacent memory layers. Accordingly, data operations to memory plugs 30 in different memory layers can occur without conflicts caused by shared conductive traces. A surface 183*b* of the bottommost layer A can be positioned over a substrate (not shown) that carries active circuitry (e.g., including components of system 120) that communicates with the memory layers through an interconnect structure (not shown). Although a small number of memory plugs 30 are depicted in FIGS. 1C through 1F in order to simplify illustration of the arrays 100, 150, and 160, the actual number of memory plugs 30 is application dependent and in practice, the arrays 100, 150, and 160, can be any size and can include an equal or an unequal number of rows and columns.

Memory Plugs

Figure 2A:
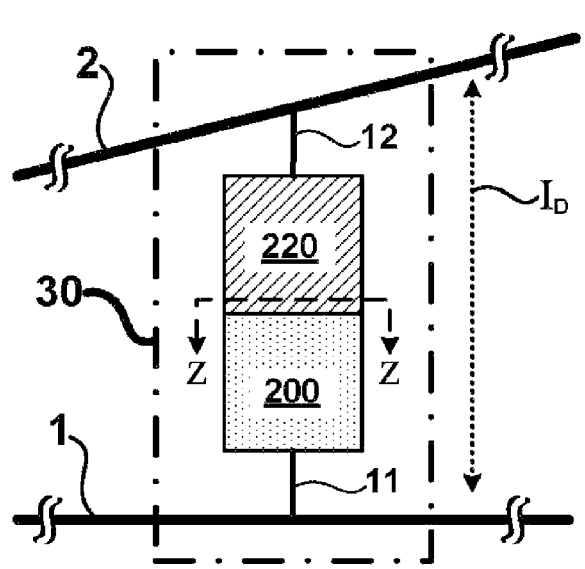
FIG. 2A is a cross-sectional view depicting one embodiment of a memory plug.

Turning now to FIG. 2A, each array 100, 150, or 160, includes a plurality of memory plugs 30. Each memory plug 30 includes a first terminal 11 electrically coupled with only one of the first conductive traces 1, a second terminal 12 electrically coupled with only one of the second conductive traces 2, a memory element 200, and a threshold device 220. The memory element 200 and the threshold device 220 are electrically in series with each other and are electrically in series with the first and second terminals 11 and 12. The configuration depicted in FIG. 2A may be reversed with the threshold device 220 positioned below the memory element 200. During data operations to the memory plug 30, a current $I_D$ flows through the memory plug 30. For example, during a read operation the current $I_D$ will be a read current. The magnitude and direction of the current $I_D$ will depend in part on a magnitude and polarity of select voltage potentials applied to the conductive traces 1 and 2. Each memory plug 30 can include a portion of the first and second conductive traces 1 and 2 as denoted by the dashed line for the memory plug 30. Furthermore, the memory plug 30 includes any other materials desirable for fabrication or functionality. For example, the memory plug 30 can include one or more electrode layers, seed layers, glue layers, adhesion layers, buffer layers, diffusion barriers, and anti-reflection layers, just to name a few. Preferably, for a two-terminal cross-point array configuration, the plurality of first conductive traces 1 and the plurality of second conductive traces 2 are substantially orthogonal to each other and each memory plug 30 is positioned substantially at an intersection of a first conductive trace 1 with a second conductive trace 2. In that the memory element 200 and the threshold device 220 are electrically in series with their respective first and second terminals 11 and 12, current flows between the first and second terminals 11 and 12 when a voltage of sufficient magnitude is applied across the first and second conductive traces 1 and 2.

The memory element 200 stores data as a plurality of conductivity profiles with discrete resistances at certain voltages. Therefore, each memory element 200 can be schematically depicted as a resistor that is electrically in series with the threshold device 220. A resistance at a certain voltage of a specific memory element 200 is indicative of a value of stored data in that memory element 200. As an example, each memory element 200 can store a single bit of data as one of two distinct conductivity profiles having a first resistive state $R_0$ at a read voltage $V_R$ indicative of a logic "0" and a second resistive state $R_1$ at $V_R$ indicative of a logic "1", where $R_0 \neq R_1$. Preferably, a change in conductivity, measured at the read voltage $V_R$, between $R_0$ and $R_1$ differs by a large enough factor so that the sense unit 105 can distinguish the $R_0$ state from the $R_1$ state. For example, the factor can be at least a factor of approximately 5. Preferably, the predetermined factor is approximately 10 or more (e.g., $R_0 \approx 1$ M$\Omega$ and $R_1 \approx 100$ k$\Omega$). The larger the predetermined factor is, the easier it is to distinguish between resistive states $R_0$ and $R_1$. The memory elements 200 are not necessarily linear resistors and the resistance of the memory elements 200 may not be a linear function of the voltage applied across the memory elements 200.

Therefore, a resistance $R_S$ of the memory elements 200 can approximately be a function of the read voltage $V_R$ such that $R_S \approx f(V_R)$. For example, the non-linear resistance may be attributed in part to the memory elements 200 exhibiting a hysteresis that results in a non-linear I-V characteristic over a range of voltages (e.g., read, write, and half-select voltages) applied across the terminals 11 and 12. The hysteresis can result in one or more voltage thresholds for reading data from and writing data to selected memory elements 200. Moreover, because the threshold device 220 is electrically in series with the memory element 200, a resulting series resistance creates a voltage drop across the threshold device 220 such that the actual voltage across the memory element 200 will be less than the voltage applied across the terminals 11 and 12. As one example, if the read voltage $V_R \approx 3V$ and the voltage drop across the threshold device is approximately 2.0V, then an effective read voltage across the memory element 200 is approximately 1.0V.

The threshold device 220 creates an I-V characteristic curve that falls within an operational current-voltage during data operations to the memory plug 30 that substantially reduces are eliminates current flow when the memory plug 30 is not selected for a read or write operation. The threshold device 220 allows data to be written to the memory element 200 when a write voltage $V_W$ of appropriate magnitude and polarity is applied across the first and second terminals 11 and 12 of a selected memory plug 30'. Moreover, the threshold device 220 allows data to be read from the memory element 200 when a read voltage $V_R$ of appropriate magnitude and polarity is applied across the first and second terminals 11 and 12 of a selected memory plug 30'. An additional function of the threshold device is to substantially reduce or eliminate current flow through half-selected and un-selected memory plugs 30. Furthermore, as was described above, the memory element 200 can have a resistance that is a function of applied voltage, such that the memory element 200 can also exhibit a non-linear I-V characteristic. As a result, the memory plug 30 has a non-linear I-V characteristic that can be due to the threshold device 220 or a combined effect of the non-linear I-V characteristics of the threshold device 220 and the memory element 200.

Memory Elements

Figure 2C:
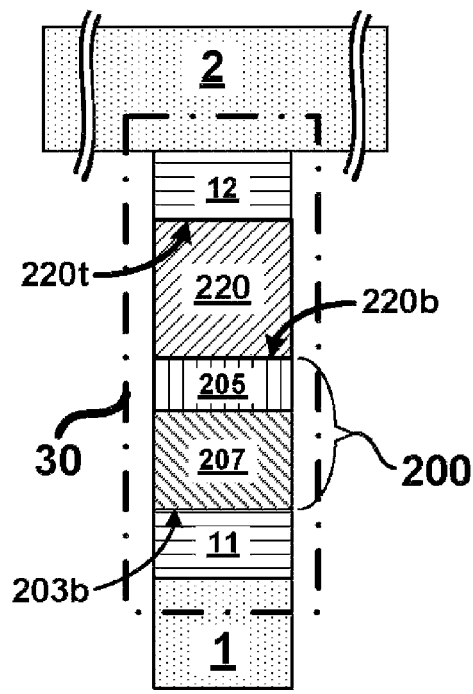
FIG. 2C is a cross-sectional view depicting a third embodiment of a memory plug.
Figure 2B:
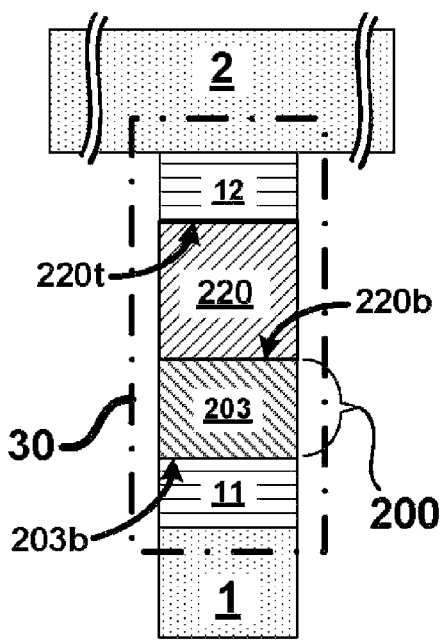
FIG. 2B is a cross-sectional view depicting a second embodiment of a memory plug.

Referring now to FIG. 2B, the memory element 200 can be a layer 203 of a material that changes conductivity in response to an appropriate voltage applied across the terminals 11 and 12. For example, suitable materials for the layer 203 include but are not limited to a colossal magnetoresistive material (CMR), a conductive metal oxide material, a manganite, and a perovskite, just to name a few. The layer 203 can be coupled with other layers of materials to the extent those materials are necessary for operation of the memory element 200 or to the extent fabrication methods require them. For example, the memory element 200 can be connected with one or more layers of an electrically conductive material (e.g., an electrode). A first electrode can be positioned between a surface 203b of the layer 203 and the first terminal 11 and a second electrode can be positioned between a surface 220b of the threshold device 220 and the layer 203. Suitable materials for the electrodes include but are not limited to platinum (Pt), tungsten (W), aluminum (Al), palladium (Pd), iridium (Ir), gold (Au), copper (Cu), chromium (Cr), titanium (Ti), tantalum (Ta), tantalum nitride (TaN), refractory metals, alloys of those materials, and any material that is sufficiently conductive and does not react with the metal oxide.

An exemplary memory element that stores data as a plurality of distinct conductivity profiles is described in U.S. patent application Ser. No. 11/095,026, filed Mar. 30, 2005, now U.S. Published Application No. 2006/0171200, and titled "Memory Using Mixed Valence Conductive Oxides," hereby incorporated by reference in its entirety and for all purposes, describes non-volatile third dimension memory cells that can be arranged in a cross-point array. The application describes a two terminal memory element that changes conductivity when exposed to an appropriate voltage drop across the two terminals. The memory element includes both a mixed ionic electronic conductor and a layer of material that has the bulk properties of an electrolytic tunnel barrier (i.e., properties of an electronic insulator and an ionic conductor). A voltage drop across the electrolytic tunnel barrier causes an electrical field within the mixed ionic electronic conductor that is strong enough to move oxygen ($O_2$) ions out of the mixed ionic electronic conductor and into the electrolytic tunnel barrier. Oxygen depletion causes the mixed ionic electronic conductor to change its conductivity. Both the electrolytic tunnel barrier and the mixed ionic electronic conductor do not need to operate in a silicon substrate, and, therefore, can be fabricated above circuitry being used for other purposes (e.g., selection circuitry, sense amps, and address decoders). A memory is "third dimension memory" when it is fabricated above other circuitry components, the components usually including a silicon substrate, polysilicon layers and, typically, metallization layers, for example. Turning now to FIG. 2C, the memory element 200 includes a mixed ionic electronic conductor 207 and electrolytic tunnel barrier 205 in contact with the mixed ionic electronic conductor 207. In some applications, one or more additional layers of thin film materials are positioned between a surface 220b and the electrolytic tunnel barrier 205 and between the surface 203b and the mixed ionic electronic conductor 207. The additional layers are included when those thin film materials are necessary for operation of the memory element 200 or to the extent fabrication methods require them.

The two-terminal memory elements can be arranged in a cross-point array such that one terminal is electrically coupled with an x-direction line and the other terminal is electrically coupled with a y-direction line. A stacked cross-point array consists of multiple cross-point arrays vertically stacked upon one another, sometimes sharing x-direction and y-direction lines between layers, and sometimes having isolated lines. When a first write voltage $V_{W1}$ is applied across the memory element, (typically by applying ½$V_{W1}$ to the x-direction line and ½-$V_{W1}$ to the y-direction line) it switches to a low resistive state. When a second write voltage $V_{W2}$ is applied across the memory element, (typically by applying ½$V_{W2}$ to the x-direction line and ½-$V_{W2}$ to the y-direction line) it switches to a high resistive state. Typically, memory elements using electrolytic tunnel barriers and mixed ionic electronic conductors require $V_{W1}$ to be opposite in polarity from $V_{W2}$.

Threshold Devices

Figure 2D:
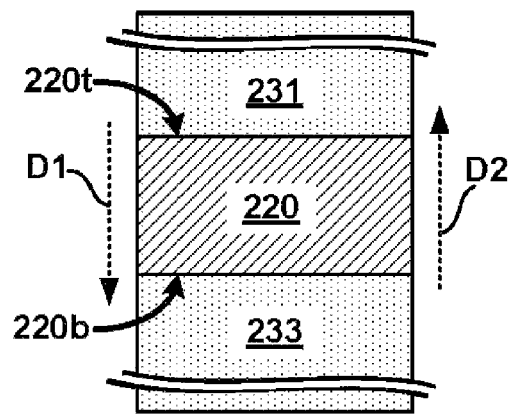
FIG. 2D is a cross-sectional view depicting one embodiment of a threshold device.

In FIG. 2D, the threshold device 220 can include electrically conductive layers 231 and 233. Typically, the electrically conductive layers 231 and 233 function as electrodes connected with a surface 220t and/or a surface 220b of the threshold device 220. As will be described in greater detail below, work function W is a criteria that can be used to select the materials for the electrically conductive layers 231 and 233. The electrically conductive layers 231 and 233 may be included to the extent those layers are necessary for operation of the threshold device 220 or to the extent fabrication methods require them. As one example, if the aforementioned electrodes connected with the memory element 200 are made from materials that are compatible with the threshold device 220, then one or both of the electrically conductive layers 231 and 233 can be eliminated. Suitable materials for the electrically conductive layers 231 and 233 include but are not limited to metals (e.g., aluminum Al, platinum Pt, palladium Pd, iridium Ir, gold Au, copper Cu, tantalum Ta, tantalum nitride TaN, titanium (Ti), and tungsten W), metal alloys, refractory metals and their alloys, and semiconductors (e.g., silicon Si). The choice of materials for the electrodes 231 and 233 can affect both current density and I-V characteristic slopes for the threshold device 220.

Data Operations

As was described above, data operations to the arrays (100, 150, and 160) can include read and write operations. In some embodiments, data operations can include a read before write operation operative to determine if a value of data to be written to a selected memory plug 30' is approximately equal to the value of stored data in the selected memory plug 30'. If the value of the stored data and the value of the data to be written are approximately equal, then the write operation can be aborted before overwriting the stored data with a redundant value. In either case, a data operation to a selected memory plug 30' requires the application of select voltage potentials to effectuate reading data from or writing data to the selected memory plug 30'. Data operations also result in some memory plugs 30 being half-selected or un-selected. The voltage across half-selected and un-selected memory plugs 30 can result in current flow that increases power dissipation and reduces read operation signal to noise ratio.

Read Operations

Figure 3:
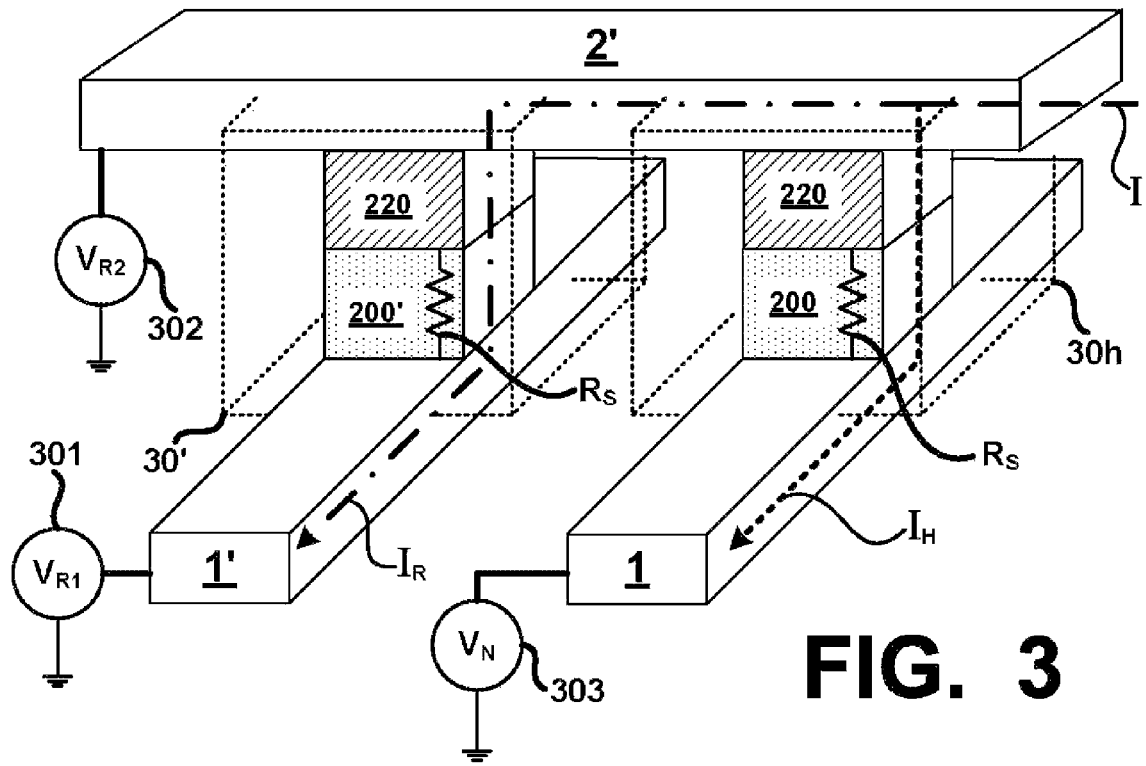
FIG. 3 is a schematic view depicting selected and half-selected memory plugs during a read operation to a two-terminal cross-point array.

Turning to FIG. 3, a portion of an array (e.g., the array 100) is depicted during a read operation. A first read voltage potential $V_{R1}$ and a second read voltage potential $V_{R2}$ are applied to the selected first and second conductive traces 1' and 2' respectively. The first and second read voltage potentials $V_{R1}$ and $V_{R2}$ may differ in magnitude and/or polarity so that a potential difference denoted as a read voltage $V_R$ is applied across the selected first and second conductive traces 1' and 2' (e.g., $V_R \approx V_{R2} - V_{R1}$). The read voltage $V_R$ generates a read current $I_R$ that flows through the selected memory plug 30'. A non-select voltage potential $V_N$ is applied to the first conductive trace 1 resulting in a potential difference across conductive traces 2' and 1. The potential difference is denoted as a half-select voltage $V_H$ (e.g., $V_H \approx V_{R2} - V_N$). The half-select voltage $V_H$ can generate a half-select current $I_H$ that flows through the half-selected memory plug 30h. Although the size of the array 100 will be application dependent, high-density data storage applications will require very large arrays with several thousand or more memory plugs 30 in each row and column of the array 100. Therefore, in the exampled depicted in FIG. 3, in addition to the selected memory plug 30', there can be several thousand or more half-selected memory plugs 30h electrically coupled to the selected second conductive trace 2' (i.e., in the same array column). Consequently, the read current $I_R$ can be a small portion of a current I flowing through the selected second conductive trace 2' and a sum of all the half-select currents $I_H$ can be a substantial portion of the current I.

During read operations, one function of the threshold device 220 is to allow a sufficient magnitude of read current $I_R$ to flow through the selected memory plug 30' at the read voltage $V_R$ while substantially reducing or eliminating half-select current $I_H$ flowing through half-selected memory plugs 30h at the half-select voltage $V_H$. By reducing or eliminating half-select current $I_H$, power consumption is reduced and a signal to noise ratio (S/N) between the read current $I_R$ and the sum total of the half-select currents $I_H$ is increased. Furthermore, substantially reducing or eliminating half-select current $I_H$ can prevent data corruption to the resistive states $R_S$ of half-selected memory plugs 30h (e.g., read disturb). A high S/N ratio is preferable so that the sense unit 105 (see FIG. 1) can accurately sense a magnitude of the read current $I_R$ that is indicative of the stored data in the selected memory plug 30'. The magnitude of the read current $I_R$ will be a function of the read voltage $V_R$ across the selected memory plug 30' and a resistive state $R_S$ of a selected memory element 200'. For example, if a logic "0" represents a high resistance and a logic "1" represents a low resistance, then for a constant read voltage $V_R$, a magnitude of the read current $I_R$ is indicative of the resistive state $R_S$ of the selected memory element 200'. Therefore, the magnitude of the read current $I_R$ is lowest when the stored data is a logic "0" (e.g., high resistance) and is highest when the stored data is a logic "1" (e.g., low resistance).

Write Operations

Figure 4:
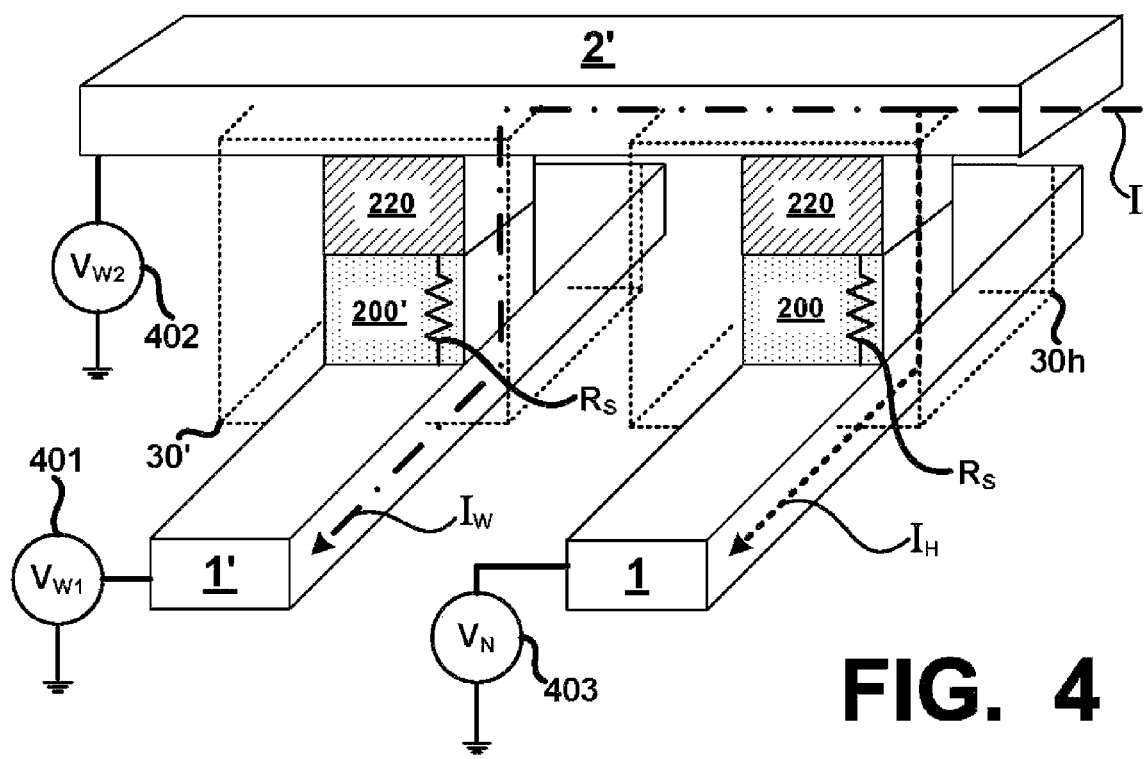
FIG. 4 is a schematic view depiction selected and half-selected memory plugs during a write operation to a two-terminal cross-point array.

Reference is now made to FIG. 4, where during a write operation to selected memory plug 30', a first write voltage potential $V_{W1}$ is applied to selected first conductive trace 1' and a second write voltage potential $V_{W2}$ is applied to selected second conductive trace 2'. A non-select voltage potential $V_N$ is applied to un-selected first conductive trace 1. Consequently, selected memory plug 30' is selected for a write operation and memory plug 30h is half-selected. As was described above, in a very large array 100, there can be several thousand or more half-selected memory plugs 30h coupled with the selected second conductive trace 2'. The potential difference across the selected memory plug 30' is denoted as the write voltage $V_W$ (e.g., $V_W \approx V_{W2} - V_{W1}$). Typically, a magnitude of the write voltage $V_W$ is greater than a magnitude of the read voltage $V_R$ (i.e., $V_W > V_R$) by a factor of approximately 1.5 to 3, for example. The resistive state $R_S$ of the selected memory plug 30' can be changed by applying an appropriate magnitude and polarity of the write voltage $V_W$ across the selected conductive traces 1' and 2'. As one example, if the selected memory plug 30' is initially in the first resistive state $R_0$ (e.g., high resistance) indicative of a logic "0", then to overwrite the logic "0" with a logic "1", a negative write voltage potential (e.g., $-V_{W2}$) is applied to the selected second conductive trace 2' and a positive write voltage potential (e.g., $+V_{W1}$) is applied to the selected first conductive trace 1'. As a result, the selected memory plug 30' is overwritten and the first resistive state $R_0$ is replaced by the second resistive state $R_1$ (e.g., low resistance). Conversely, to overwrite the second resistive state $R_1$, a positive write voltage potential (e.g., $+V_{W2}$) is applied to the selected second conductive trace 2' and a negative write voltage potential (e.g., $-V_{W1}$) is applied to the selected first conductive trace 1'. Consequently, the stored data in the selected memory element 200' is overwritten thereby replacing the second resistive state $R_1$ with the first resistive state $R_0$. In some embodiments, the memory plugs 30 may be configured to store more than one bit of data and the magnitude and polarity of the write voltage $V_W$ can be varied to effectuate writing multi-bit data to selected memory plugs 30'. For example, if each memory plug 30 can store two-bits of data (e.g., $R_0$, $R_1$, $R_2$, and $R_3$ representing binary "00", "01", "10", and "11" respectively), then the writing of each resistive state can be accomplished by an appropriate magnitude and polarity of the write voltage $V_W$ applied across the terminals of the selected memory plugs 30'.

During write operations, a write current $I_W$ flows through the selected memory plug 30' and half-select current $I_H$ flows through the half-selected memory plug 30h. However, for write operations, it is the half-select currents $I_H$ that are of the greatest concern because depending on the magnitude of the write voltage potentials $V_{W1}$ and $V_{W2}$, the magnitude of the half-select current $I_H$ can be higher for write operations than for read operations. Therefore, one function of the threshold device 220 is to allow a sufficient magnitude of the write voltage $V_W$ for writing data to the selected memory plug 30' while substantially reducing or eliminating half-select current $I_H$ in half-selected memory plugs 30h. Benefits to reducing or eliminating half-select current $I_H$ during write operations include reduce power consumption and prevention of data corruption to the resistive state $R_S$ of half-selected memory plugs 30h (e.g., write disturb).

Select Voltage Effects

Turning now to FIG. 5, during data operations to the array 100, the application of select and non-select voltages result in three possible selection status for memory plugs 30 (assuming none of the conductive traces 1 and 2 are allowed to float): un-selected memory plugs; half-selected memory plugs; and at least one selected memory plug. The array 100 is depicted with first conductive traces 1 in rows r0, r1, and r3 at a row non-select voltage potential $V_{NR}$ and second conductive traces 2 in columns c0, c1, and c3 at a column non-select voltage potential $V_{NC}$. A row select voltage potential $V_{SR}$ is applied to selected first conductive trace 1' in row r2 and a column select voltage potential $V_{SC}$ is applied to selected second conductive trace 2' in column c2. As a result, the memory plug at position m10 in the array 100 is a selected memory plug 30'. Typically, the magnitude and polarity of the select voltage potentials $V_{SR}$ and $V_{SC}$ will depend on the type of data operation (e.g., read or write). Consequently, in the array 100 there nine are un-selected memory plugs 30 having both terminals 11 and 12 at the non-select voltage potentials $V_{NR}$ and $V_{NC}$ and six half-selected memory plugs 30 having one terminal coupled with one of the non-select voltage potentials (e.g., $V_{NR}$ or $V_{NC}$) and the other terminal coupled with one of the select voltage potentials (e.g., $V_{SR}$ or $V_{SC}$).

Un-Selected Memory Plugs

FIG. 5A depicts an exemplary un-selected memory plug 30. The memory plug 30 is un-selected because both of its terminals 11 and 12 are at the non-select voltage potentials $V_{NR}$ and $V_{NC}$ respectively. Preferably, the non-select voltages $V_{NR}$ and $V_{NC}$ are equal to each other so that no current flows through un-selected memory plugs 30. The non-select voltages $V_{NR}$ and $V_{NC}$ can be generated by the same voltage source or by separate voltage sources. If separate voltage sources are used, then it is preferable for the voltages supplied be equal voltages (e.g., $V_{NR} \approx V_{NC}$) to eliminate a current $I_U$ from flowing through unselected memory plugs 30. The non-select voltages $V_{NR}$ and $V_{NC}$ are not necessarily the same for read and write operations.

Preferably, the voltage potentials for the non-select voltages $V_{NR}$ and $V_{NC}$ are approximately half-way between a first voltage potential applied to the selected first conductive trace 1' (i.e., $V_{SR}$) and a second voltage potential applied to the selected second conductive trace 2' (i.e., $V_{SC}$). For example, during read or write operations, $V_{NR} \approx V_{NC} \approx \frac{1}{2}(|V_{SR}| - |V_{SC}|)$. The non-select voltages $V_{NR}$ and $V_{NC}$ can be positive or negative voltage potentials. As one example, for a read operation, the non-select voltages are $V_{NR} \approx V_{NC} \approx \frac{1}{2}(|V_{R1}| - |V_{R2}|) \approx \frac{1}{2}|V_R|$. As another example, for a write operation, the non-select voltages are $V_{NR} \approx V_{NC} \approx \frac{1}{2}(|V_{W1}| - |V_{W2}|) \approx \frac{1}{2}|V_W|$.

Reference is now made to TABLE 1 and TABLE 2 below, which list examples of non-select voltages $V_{NR}$ and $V_{NC}$ for a range of read voltages (TABLE 1) and write voltages (TABLE 2), where $V_{NR} \approx V_{NC} \approx \frac{1}{2}(|V_{SR}| - |V_{SC}|)$. The read and write voltages can be uni-polar or bi-polar. Furthermore, the read and write voltages can be applied as voltage pulses.

One skilled in the art will appreciate that the non-select voltages $V_{NR}$ and $V_{NC}$ may not be exactly equal to each other due to process variations and/or voltage drops due to variations in as-routed length of interconnect structures, for example. As a result, when $V_{NR}$ and $V_{NC}$ are not exactly equal to each other, (e.g., $V_{NR} \approx V_{NC}$) there may be some current flow through unselected memory elements 10. Therefore, another function of the threshold device 220 is to substantially reduce or eliminate the current $I_U$ in un-selected memory plugs 30. Preferably, the threshold device eliminates the current $I_U$ even if the non-select voltages $V_{NR}$ and $V_{NC}$ are not be exactly equal to each other. As stated above, reducing or eliminating the current $I_U$ can reduce power consumption. Moreover, an effective threshold device 220 can reduce or eliminate wide variations in the current $I_U$ that can result from variations in the resistive state of the unselected memory plugs 30. For example, if a substantial majority of the unselected memory plugs 30 store data as the second resistive state $R_1$ (e.g., low resistance), then the total current $I_U$ flowing through the un-selected memory plugs 30 (e.g., $\Sigma I_U$) will be higher than the case where a substantial majority of un-selected memory plugs 30 store data as the first resistive state $R_0$ (e.g., high resistance).

TABLE 1

| $V_{R1}$ | $V_{R2}$ | $V_{NR}$ | $V_{NC}$ |
|---|---|---|---|
| +2 V | −2 V | 0 V | 0 V |
| −2 V | +2 V | 0 V | 0 V |
| +4 V | 0 V | 2 V | 2 V |
| 0 V | −4 V | −2 V | −2 V |
| +1 V | −3 V | −1 V | −1 V |
| +2 V | −1 V | +0.5 V | +0.5 V |

TABLE 2

| $V_{W1}$ | $V_{W2}$ | $V_{NR}$ | $V_{NC}$ |
|---|---|---|---|
| +3 V | −3 V | 0 V | 0 V |
| −3 V | +3 V | 0 V | 0 V |
| +6 V | 0 V | 3 V | 3 V |
| 0 V | −6 V | −3 V | −3 V |
| +4 V | −3 V | +0.5 V | +0.5 V |
| +2 V | −4 V | −1.0 V | −1.0 V |

Half-Selected Memory Plugs

Reference is now made to FIGS. 5B and 5C, where memory plugs 30 in the same row (i.e., r2) as the selected conductive trace 1' and in the same column (i.e., c2) as the selected second conductive trace 2' are half-selected memory plugs 30 because they have one terminal at a select voltage potential (e.g., $V_{SR}$ or $V_{SC}$) and the other terminal at a half-select voltage potential (e.g., $V_{NR}$ or $V_{NC}$). As a result, a potential difference across the terminals 11 and 12 can result in half-select currents $I_{HR}$ and $I_{HC}$ flowing through the half-selected memory plugs 30. A magnitude and direction of flow for the half-select currents $I_{HR}$ and $I_{HC}$ will depend in part on a polarity and a magnitude of the potential difference across the half-selected memory plugs 30. As was stated above in reference to FIGS. 3 and 4, one function of the threshold device 220 is to reduce or eliminate the half-select currents $I_{HR}$ and $I_{NC}$.

Selected Memory Plugs

Turning now to FIG. 5D, selected memory plug 30' has the select voltage potentials $V_{SR}$ and $V_{SC}$ applied to both terminals 11 and 12 resulting in a select current $I_S$ flowing through memory plug 30'. A magnitude and direction of flow of the select current $I_S$ will depend in part on the on a polarity and a magnitude of the potential difference (i.e., $V_R$ for a read or $V_W$ for a write) across selected memory plug 30'. Accordingly, for read and write operations, the current $I_S$ represents the read current $I_R$ and the write current $I_W$ respectively.

Stacked Cross-Point Arrays

The select status depicted in FIG. 5 and FIGS. 5A through 5D may also apply to each memory layer A, B, C, and D in the stacked two-terminal cross-point array 160 depicted in FIG. 1F because the conductive traces in each memory layer are not shared and are electrically isolated from the conductive traces in adjacent memory layers. Consequently, applying a select voltage to the conductive traces in one memory layer does not result in half-selected memory plugs in adjacent memory layers.

Turning now to FIG. 5E, a portion of the stacked two-terminal cross-point array 150 depicted in FIG. 1E is illustrated with memory plug 30b' in memory layer B selected for a data operation by the application of select voltage potentials (e.g., read or write voltages) to conductive traces 2a' and 1b'. Non-select voltage potentials are applied to the remaining conductive traces in memory layers A, C, and D. In that memory plugs 30a and 30c share selected conductive traces 2a' and 1b', those memory plugs and other memory plugs coupled with selected conductive traces 2a' and 1b' are half-selected memory plugs. On the other hand, memory plug 30d and other memory plugs in memory layer D are un-selected memory plugs because both of their terminals are connected with conductive traces 2d and 1c at the non-select voltage potentials. Consequently, there can be more half-selected memory plugs in a stacked two-terminal cross-point array in which conductive traces are shared between memory plugs in adjacent memory layers. Therefore, an effective threshold device 220 for reducing or eliminating half-select current may be critical in stacked two-terminal cross-point arrays to prevent data disturbs and to reduce power dissipation which can be exacerbated by the increased number of half-selected memory plugs in the multiple memory layers.

Read Operation Thresholds

Referring to FIG. 6, an exemplary application of select and non-select voltage potentials for a read operation to the array 100 is depicted. Voltage sources 601 and 603 apply select voltage potentials $V_{R1}$ and $V_{R2}$ to selected conductive traces 1' and 2'. Voltage sources 605 and 607 apply non-select voltage potentials $V_{NR}$ and $V_{NC}$ to the remaining conductive traces 1 and 2. Consequently, memory plug 30' at position m10 (i.e., in row r2 and column c2, FIG. 6D) is selected for a read operation with the read voltage being the potential difference between the first and second read voltage potentials (i.e., $V_R \approx V_{R1} - V_{R2}$). Therefore, the selection status of the memory plugs in the array 100 is as follows: nine un-selected memory plugs 30 (m0, m1, m3, m4, m5, m7, m12, m13, and m15); six half-selected memory plugs 30 (m2, m6, m14 in column c2 and m8, m9, m11 in row r2); and one selected memory plug 30' (m10). As was described above, it is desirable to eliminate or substantially reduce the half-select currents $I_{HR}$ and $I_{HC}$ flowing through the half-selected memory plugs 30 in FIGS. 6B and 6C respectively and the current $I_U$ flowing through un-selected memory plugs 30 in FIG. 6A. For example, from TABLE 1, using $V_{R1} \approx +2V$ and $V_{R2} \approx -1V$, the read voltage $V_R \approx V_{R1} - V_{R2} \approx 2V - (-1V) \approx 3V$, and the non-select voltages $V_{NR}$ and $V_{NC} \approx +0.5V$, then the half-select voltages across half-selected memory plugs 30 (m8, m9, m11 in row r2 and m2, m6, m14 in column c2) are $V_{HRead} \approx V_{R1} - V_{NC} \approx 2.0V - 0.5V \approx +1.5V$ and $V_{HRead} \approx V_{NR} - V_{R2} \approx +0.5V - (-1.0V) \approx +1.5V$, respectively. Therefore, the un-select voltage $V_U$ across un-selected memory plugs 30 (m0, m1, m3, m4, m5, m7, m12, m13, and m15) is approximately 0V (i.e., $V_U \approx V_{NR} - V_{NC} \approx 0.5V - 0.5V \approx 0V$).

Figure 2E:
FIG. 2E is a top plan view depicting a cross-sectional area of a portion of a memory plug.

Based on the above, if the magnitude of the read voltage $|V_R|\approx 3.0V$, the first resistive state $R_0\approx 10$ M$\Omega$ at $V_R$, the second resistive state $R_1\approx 2$M$\Omega$ at $V_R$, and the voltage drops across the threshold device 220 and the memory element 200 are approximately 2.0V and 1.0V respectively at $V_R$, then the read current $I_R$ flowing through the selected memory plug 30' is highest when the memory element 200 is in the low resistance state of $R_1\approx 2$M$\Omega$ and is lowest when the memory element 200 is in the high resistance state of $R_0\approx 10$M$\Omega$. Therefore, given the voltage drop of approximately 1.0V across the memory element 200, a minimum value for the read current $I_R\approx V_R\div R_0\approx 1.0V\div 10$ M$\Omega\approx 100$ nA and a maximum value for the read current $I_R\approx V_R\div R_1\approx 1.0V\div 2$M$\Omega\approx 500$ nA. A corresponding read current density $J_R$ for a selected memory plug 30' having a cross-sectional area of approximately 0.01 $\mu m^2$ is $\approx 10.0$ A/cm$^2$ at $R_0$ and $\approx 50.0$ A/cm$^2$ at $R_1$. Consequently, a desired value for the half-select currents $I_{HR}$ and $I_{HC}$ is selected to minimize power consumption and to increase signal-to-noise ratio (S/N) relative to the read current $I_R$ (e.g., the minimum read current) during read operations. Although the desired operational values for the currents $I_R$, $I_{HR}$, and $I_{HC}$ will be application specific and may depend on several factors including but not limited: to the size of the array 100 (e.g., the number of rows and columns), which for a two-terminal cross-point array, will determine the number of memory plugs 30 in the array; the magnitude and polarity of the read voltage $V_R$; the approximate values for the resistive states (e.g., $R_0$ and $R_1$); the non-linear I-V characteristic for the memory element 200; the non-linear I-V characteristic for the threshold device 220; the combined effect of the non-linear I-V characteristics for the threshold device 220 and the memory element 200; the circuitry used for sensing the read current $I_R$; leakage of transistors used in the circuitry used to select the conductive traces, a desired minimum S/N ratio for read operations (e.g., as determined by sense circuit requirements); a desired maximum power consumption; and an allowable value for a current density for the memory plug 30 (e.g., based on a cross-sectional area of the memory plug 30, see 31A in FIG. 2E).

As one example, during a read operation to the array 100, the worse case S/N ratio can be set to approximately 25. Worse case S/N ratio can be determined based on several factors including design considerations for the circuitry used for sensing currents flowing through the conductive traces 1 and 2 and the minimum value for the read current (e.g., $I_R\approx 100$ nA for the high resistance state $R_0$), for example. An allowable magnitude for the total half-select current (i.e., $\Sigma I_{HR}+\Sigma I_{HC}$) in the array 100 will be $\approx 100$ nA$\div 25\approx 4.0$ nA. After determining the desired S/N ratio, a maximum allowable half-select current per half-selected memory plug 30 can be selected to be a predetermined factor PF$_{Read}$ of the total half-select current. For example, PF$_{Read}$ can be the number of memory plugs 30 in the same row as the selected memory plug 30', the same column as the selected memory plug 30', or both. Referring back to FIG. 6, there are three half-selected memory plugs 30 in row r2 and three half-selected memory plugs 30 in column c2. Therefore, using the total number of half-selected memory plugs, the predetermined factor PF$_{Read}\approx 6$ and the maximum allowable half-select current per half-selected memory plug 30 is approximately 4.0 nA$\div 6\approx 0.7$ nA.

Figure 7A:
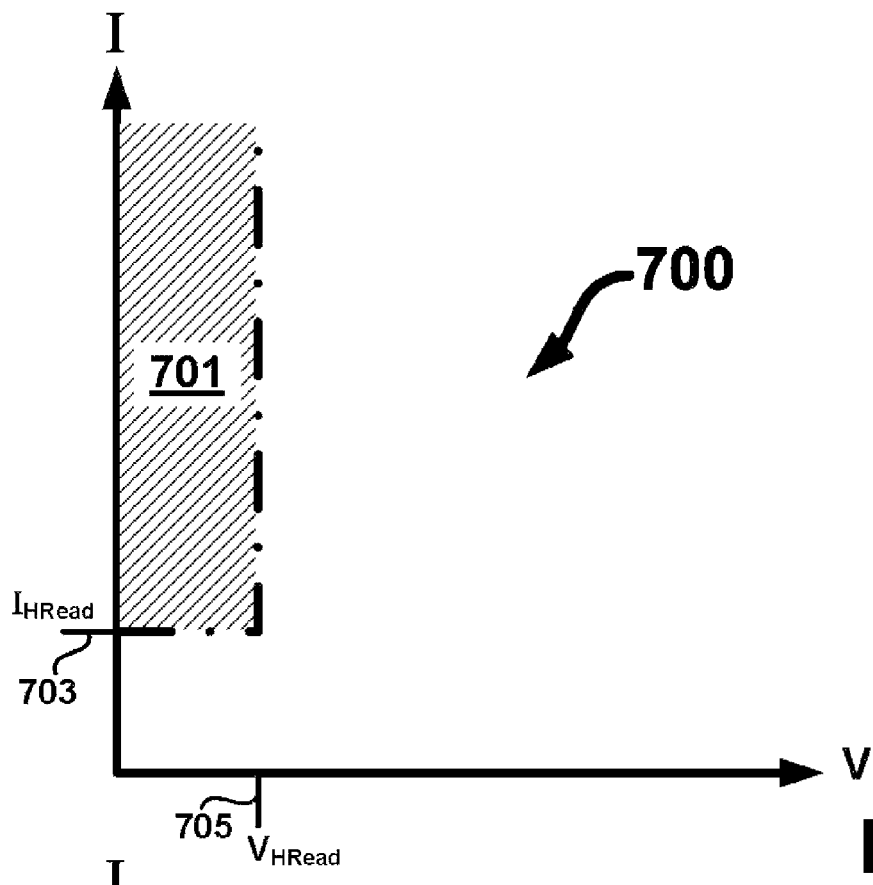
FIG. 7A depicts an operational current voltage range for a first region during a read operation.

Turning now to FIG. 7A, an I-V graph 700 depicts a magnitude of the half-select currents ($I_{HR}$, $I_{HC}$) on a current axis I (using a log scale) and a magnitude of the half-select voltages on a voltage axis V. A first operational current-voltage range 701 for half-selected memory plugs 30 (see FIGS. 6B and 6C) defines an enclosed region during a read operation to the array 100 where the half-select currents ($I_{HR}$, $I_{HC}$) exceed a maximum allowable half-select current $I_{HRead}$ per half-selected memory plug 30 (e.g., $I_{HRead}\approx 0.7$ nA) as denoted by line 703. The first operational current-voltage range 701 also defines an enclosed region where the half-select voltages across half-selected memory plugs 30 are below a minimum allowable voltage $V_{HRead}$ (e.g., $V_{HRead}\approx 1.5$V) denoted by line 705. Preferably, during read operations, the half-select currents and voltages do not enter into the enclosed region defined by the first operational current-voltage range 701 such that the half-select currents ($I_{HR}$, $I_{HC}$) are approximately $\leq I_{HRead}$ and the half-select voltages are approximately $\geq V_{HRead}$.

One skilled in the art will appreciate that if the non-select voltages ($V_{NR}$, $V_{NC}$) are substantially equal to each other (e.g., $V_{NR}\approx V_{NC}\approx 0.7$V), then the un-select current $I_U$ (see FIG. 6A) flowing through un-selected memory plugs 30 will be substantially zero and will be below the line 703. Similarly, the voltage across un-selected memory plugs 30 will also be below the voltage denoted by line 705. Consequently, the voltage across and the current through un-selected memory plugs 30 will not enter into the enclosed region defined by the first operational current-voltage range 701.

Figure 7B:
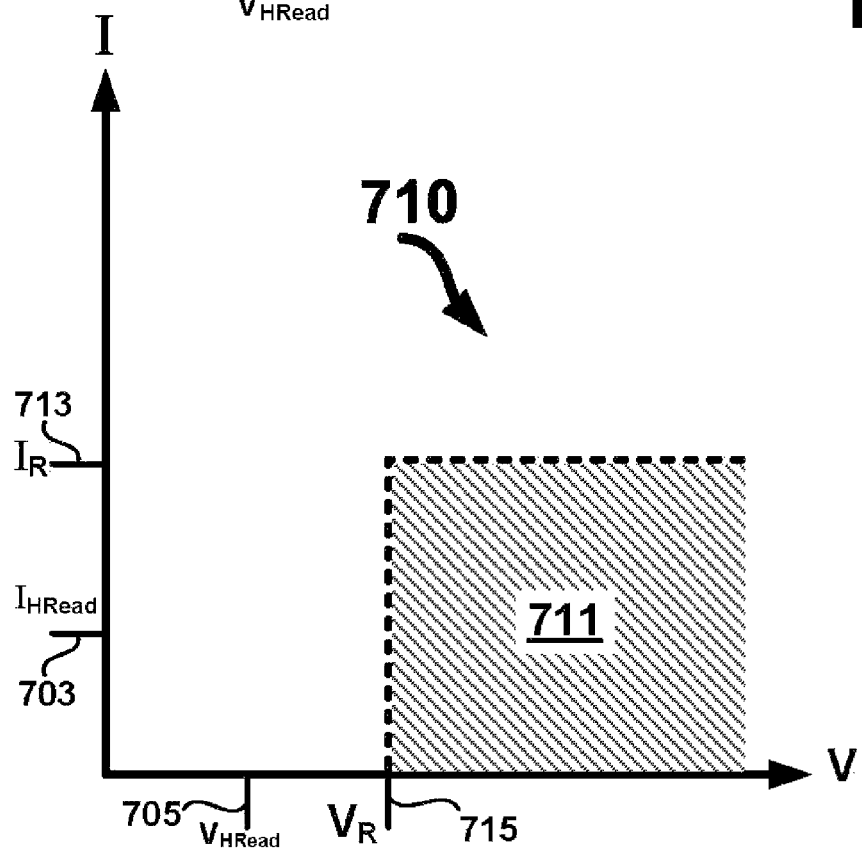
FIG. 7B depicts an operational current voltage range for a second region during a read operation.

Referring now to FIG. 7B, an I-V graph 710 depicts a magnitude of the read current on a current axis I (using a log scale) and a magnitude of the read voltage on a voltage axis V. A second operational current-voltage range 711 defines an enclosed region during a read operation to the array 100 where the read current through a selected memory plug 30' is below a minimum allowable value $I_R$ (e.g. $R_0\approx 10$ M$\Omega$ and $I_R\approx 100$ nA) as denoted by a line 713 and the read voltage exceeds a maximum allowable value $V_R$ (e.g. $V_R\approx 3.0$V) as denoted by line 715. Preferably, during a read operation, the read current $I_R$ and read voltage $V_R$ do not enter into the enclosed region defined by the second operational current-voltage range 711 such that the read current is approximately $\geq I_R$ and the read voltage is approximately $\leq V_R$. Essentially, the second operational current-voltage range 711 depicts a region where $I_R$ is too low and $V_R$ is too high. If the read current $I_R$ is too low (i.e., $I_R$ is in the region 711), then the sense unit 105 may not be able to distinguish the read current from the total half-select current flowing through half-selected memory plugs (e.g., the S/N ratio is too low). In that the read voltage $V_R$ is typically lower in magnitude than the write voltage $V_W$, the magnitude of the read voltage $V_R$ across the selected memory plug 30' is held at or below the voltage at line 715 to prevent overwriting stored data in the selected memory plug 30', to prevent read disturbs to adjacent half-selected memory plugs 30, and to reduce power consumption. The magnitude of the read current $I_R$ will depend in part on the resistive state of the selected memory plug 30'. Therefore, at $V_R$, the read current $I_R$ will be higher on the current axis I when the selected memory plug 30' stores data in the second resistive state (e.g., $R_1\approx 2$M$\Omega$ and $I_R\approx 500$ nA) and lower on the current axis when the selected memory plug 30' stores data in the first resistive state (e.g. $R_0\approx 10$ M$\Omega$ and $I_R\approx 100$ nA).

Write Operation Thresholds

Figure 8:
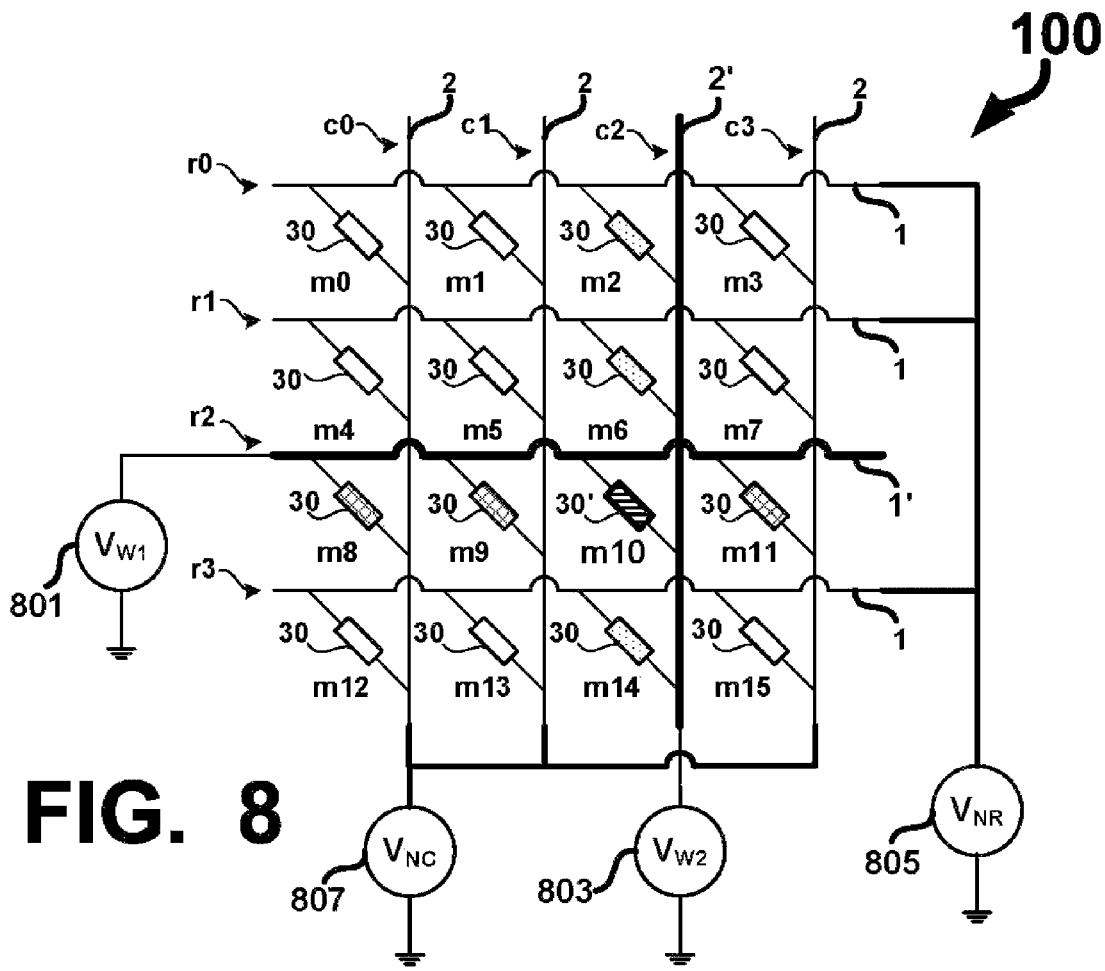
FIG. 8 is a schematic view depicting one embodiment of a two-terminal cross-point memory array during a write operation.
Figure 8A:
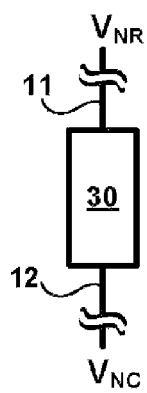
FIG. 8A depicts an unselected memory plug during a write operation.
Figure 8B:
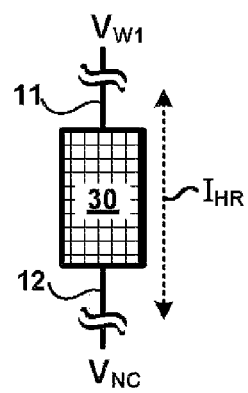
FIGS. 8B and 8C depict half-selected memory plugs during a write operation.
Figure 8C:
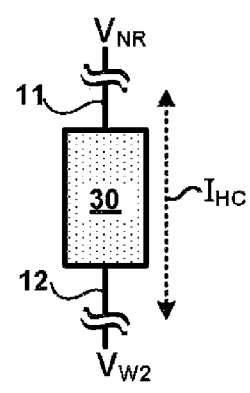
Figure 8D:
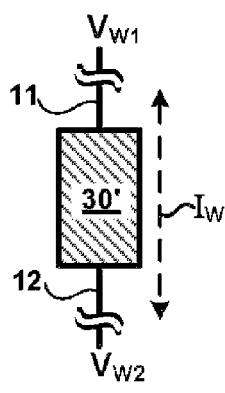
FIG. 8D depicts a selected memory plug during a write operation.

Turning now to FIG. 8, an exemplary application of select and non-select voltages for a write operation to the array 100 is depicted. Voltage sources 801 and 803 apply select voltage potentials $V_{W1}$ and $V_{W2}$ to selected conductive traces 1' and 2'. Voltage sources 805 and 807 apply non-select voltage potentials $V_{NR}$ and $V_{NC}$ to the remaining conductive traces 1 and 2. Consequently, memory plug 30' at position m10 (i.e., in row r2 and column c2, FIG. 8D) is selected for a write operation, with the write voltage being the potential difference between the first and second write voltage potentials (i.e., $V_W \approx V_{W1} - V_{W2}$). The selection status of the memory plugs 30 is identical to that described above in reference to FIG. 6. As was stated above, it is desirable to eliminate or substantially reduce the half-select currents $I_{HR}$ and $I_{HC}$ flowing through the half-selected memory plugs 30 in FIGS. 8B and 8C respectively and the current $I_U$ flowing through un-selected memory plugs 30 in FIG. 8A. For example, from TABLE 2, using $V_{W1} \approx +3V$ and $V_{W2} \approx -3V$ (e.g., to write the first resistive $R_0$), such that the write voltage $V_W \approx V_{W1} - V_{W2} \approx +3V - (-3V) \approx +6V$, and the non-select voltages $V_{NR}$ and $V_{NC} \approx 0V$, then a half-select voltage $V_{HWrite}$ across half-selected memory plugs 30 (m8, m9, m11 in row r2 and m2, m6, m14 in column c2) is $V_{HWrite} \approx V_{W1} - V_{NC} \approx 3.0V - 0V \approx +3.0V$ and $V_{HWrite} \approx V_{NR} - V_{W2} \approx 0V - (-3.0V) \approx +3.0V$, respectively. Therefore, the un-select voltage $V_U$ across un-selected memory plugs 30 (m0, m1, m3, m4, m5, m7, m12, m13, and m15) is approximately 0V (i.e., $V_U \approx V_{NR} - V_{NC} \approx 0V - 0V \approx 0V$).

Moreover, as described above, writing the $R_0$ state and the $R_1$ state can be accomplished using write voltages with different magnitudes and/or polarities. Therefore, again using TABLE 2, with $V_{W1} \approx -3V$ and $V_{W2} \approx +3V$ (e.g., to write the second resistive state $R_1$), such that the write voltage $V_W \approx V_{W1} - V_{W2} \approx -3V - (+3V) \approx -6V$, and the non-select voltages $V_{NR}$ and $V_{NC} \approx 0V$, then the half-select voltage across half-selected memory plugs 30 (m8, m9, m11 in row r2) is $V_{W1} - V_{NC} \approx -3.0V - 0V \approx -3.0V$ and the half-select voltage across half-selected memory plugs 30 (m2, m6, m14 in column c2) is $V_{NR} - V_{W2} \approx 0V - (+3.0V) \approx -3.0V$. Therefore, the un-select voltage potential across un-selected memory plugs 30 (m0, m1, m3, m4, m5, m7, m12, m13, and m15) is approximately 0V (i.e., $V_{NR} - \approx 0V - 0V \approx 0V$).

Based on the above, if the magnitude of the write voltage $|V_W| \approx 6.0V$, then the write current $I_W$ will be highest when the memory element 200 is in the second resistive state $R_1$ (e.g., $\approx 2M\Omega$) and will be lowest when the memory element 200 is in the first resistive state $R_0$ (e.g., $\approx 10$ M$\Omega$). For example, assuming voltage drops of approximately 4.0V and 2.0V across the threshold device 220 and the memory element 200 respectively, the maximum write current is $I_W \approx V_W \div R_1 \approx 2.0V \div 2$ M$\Omega \approx 1.0$ μA and the minimum write current is $I_W \approx V_W \div R_0 \approx 2.0V \div 10M\Omega \approx 200$ nA. In contrast to read operations, during write operations, obtaining a high S/N ratio is not a major factor in determining the maximum acceptable values for the half-select currents $I_{HR}$ and $I_{HC}$. However, due to the larger magnitude of the write voltage $V_W$, power consumption and data disturb may still be determining factors. Using the worst case write current $I_W \approx 1.0$ μA, a predetermined factor $PF_{Write}$ can be set to be a multiple of the total half-select current (i.e., $\Sigma I_{HR} + \Sigma I_{HC}$) for the read operation (i.e., 4.0 nA). In that the half-select voltages for the write operation (i.e., 3.0V) are larger than the half-select voltages for the read operation (i.e., 0V), the predetermined factor $PF_{Write}$ can be within a range of approximately 3 to 4. Selecting $PF_{Write} \approx 3.5$, the total half-select current (i.e., $\Sigma I_{HR} + \Sigma I_{HC}$) for a write operation is $PF_{Write} \times 4.0$ nA $\approx 3.5 \times 4.0$ nA $\approx 14.0$ nA. Therefore, with three half-selected memory plugs 30 in row r2 and three half-selected memory plugs 30 in column c2, there are a total of six half-selected memory plugs 30. Accordingly, using all six half-selected memory plugs 30, the half-select current per half-selected memory plug 30 ($I_{HR}$, $I_{HC}$) $\approx 14.0$ nA $\div 6 \approx 2.3$ nA.

Figure 9A:
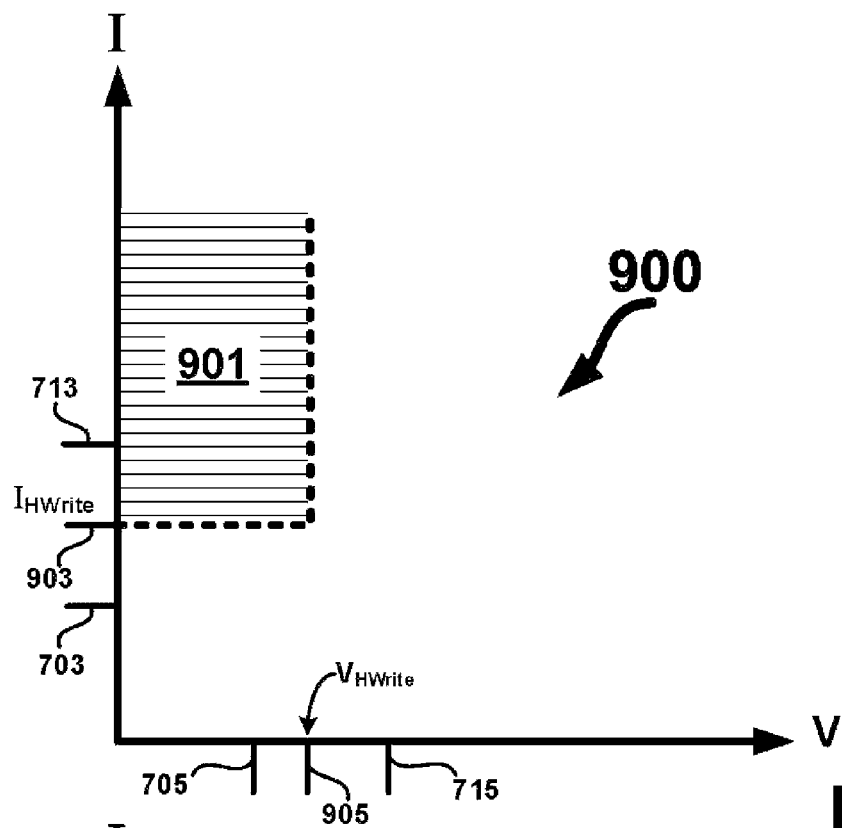
FIG. 9A depicts an operational current voltage range for a third region during a write operation.

Reference is now made to FIG. 9A, where an I-V graph 900 depicts a magnitude of the half-select currents ($I_{HR}$, $I_{HC}$) on a current axis I (using a log scale) and the magnitude of the half-select voltages on a voltage axis V. A third operational current-voltage range 901 for half-selected memory plugs 30 (see FIGS. 8B and 8C) defines an enclosed region during a write operation to the array 100 where the half-select currents ($I_{HR}$, $I_{HC}$) exceed a maximum allowable half-select current $I_{HWrite}$ per half-selected memory plug 30 (e.g., $I_{HWrite} \approx 2.3$ nA) as denoted by line 903. Similarly, a line 905 on voltage axis V denotes a minimum allowable value for the half-select voltage $V_{HWrite}$ (e.g., $V_{HWrite} \approx 3.0V$). Preferably, during write operations, the half-select currents and voltages do not enter into the third operational current-voltage range 901 such that the half-select currents ($I_{HR}$, $I_{HC}$) are approximately $\leq I_{HWrite}$ and the half-select voltages are approximately $\geq V_{HWrite}$.

Figure 9B:
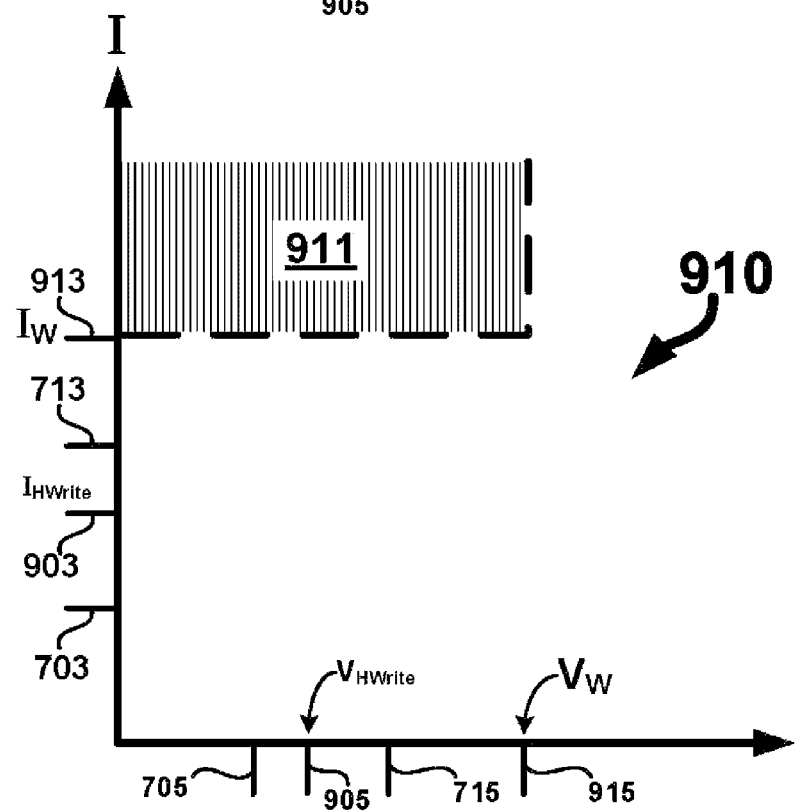
FIG. 9B depicts an operational current voltage range for a fourth region during a write operation.

Turning to FIG. 9B, an I-V graph 910 depicts a magnitude of the write current on a current axis I (using a log scale) and a magnitude of the write voltage on a voltage axis V. A fourth operational current-voltage range 911 defines an enclosed region during a write operation to the array 100 where the write current through a selected memory plug 30' exceed a maximum allowable value $I_W$ (e.g. $R_1 \approx 2M\Omega$ and $I_W \approx 1$μA) as denoted by a line 913 and the write voltage is below a minimum allowable value $V_W$ (e.g. $V_W \approx 6.0V$) as denoted by line 915. Preferably, during write operations, the write current and voltage do not enter into the region defined by the forth operational current-voltage range 911 such that the write current is approximately $\leq I_W$ and the write voltage is approximately $\geq V_W$.

Figure 10:
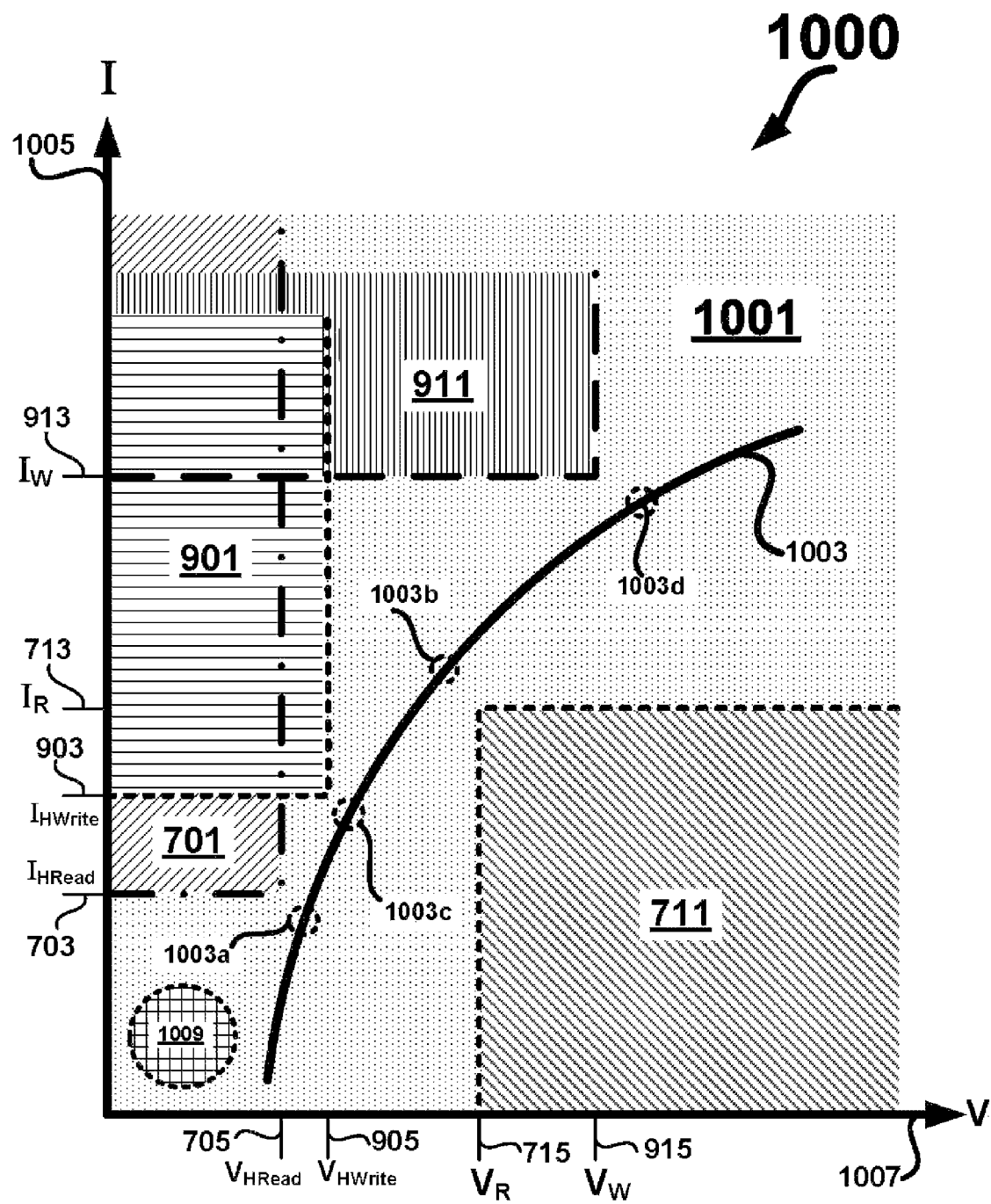
FIG. 10 depicts an exemplary characteristic I-V curve that falls within an operational current-voltage range for data operations.

Reference is now made to FIG. 10, where the operational current-voltage ranges depicted in FIGS. 7A, 7B, 9A, and 9B are combined in an I-V graph 1000 that depicts an exemplary characteristic I-V curve 1003 that falls within an operational current-voltage range 1001 for data operations to the array 100. Current through a memory plug 30 (i.e., selected, half-selected, or un-selected) is plotted on a current axis I (using a log scale) and voltage across the memory plug 30 is plotted on a voltage axis V. The characteristic I-V curve 1003 may represent the combined I-V characteristics of the threshold device 220 and the memory element 200. Characteristic I-V curve 1003 does not enter into any of the aforementioned operational current-voltage ranges 701, 711, 901, or 911 during data operations to the array 100. The actual values for the currents and voltages will be application dependent and the currents and voltages depicted in FIG. 10 are provided for purpose of explanation. As one example, the magnitude of the write voltage $V_W$ may be substantially larger than the magnitude of the read voltage $V_R$ such that the point 915 would be farther away from the point 715 on the voltage axis V.

For example, a point 1003a on the I-V curve 1003 depicts exemplary operational values for half-select current $I_{HRead}$ (i.e., $I_{HR}$ and $I_{HS}$) and half-select voltage $V_{HRead}$ (i.e., $V_{HR}$ and $V_{HC}$) for half-selected memory plugs 30 during a read operation. The point 1003a is on a segment of the curve 1003 where the half-select current $I_{HRead}$ and half-select voltage $V_{HRead}$ do not enter into the region 701. That is, the half-select current $I_{HRead}$ does not exceed the maximum allowable value denoted by line 703, the magnitude of the half-select voltage $V_{HRead}$ does not fall below the voltage denoted by line 705, and $V_{HRead}$ does not exceed the half-select write voltage $V_{HWrite}$ denoted by line 905. One skilled in the art will appreciate that the current $I_U$ for un-selected memory plugs 30 will be at or below the point 1003a assuming the non-select voltage potentials are equal or substantially equal during read operations. For example, the current $I_U$ may be substantially zero or may not fall on the curve 1003 as denoted by a region 1009 where the current through and the voltage across un-selected memory plugs 30 is substantially below that of the point 1003a.

As another example, a point 1003b on the I-V curve 1003 depicts exemplary values for the read current $I_R$ and read voltage $V_R$ for selected memory plug(s) 30' during a read operation. At the point 1003b, the read current $I_R$ and read voltage $V_R$ do not enter into the region 711, the read current $I_R$ is above the minimum acceptable value denote by line 713 and the magnitude of the read voltage $V_R$ does not exceed the maximum acceptable value denoted by line 715. One skilled in the art will understand that the magnitude for the read voltage $V_R$ at the point 1003b takes into account that a portion of the read voltage $V_R$ drops across the threshold device 220 and that voltage drop (i.e., applied voltage bias) must be of sufficient magnitude to allow current to tunnel though the threshold device 220 as the read current $I_R$. The points 1003a and 1003b depict exemplary read operation I-V characteristics that satisfy the aforementioned goals of low power consumption for half-selected memory plugs 30, minimal or no power consumption for un-selected memory plugs 30, a high S/N ratio for sensing the read current $I_R$, and a magnitude of the read voltage $V_R$ that is less than a magnitude of the write voltage $V_W$ while sufficient to read stored data without causing read disturb in half-selected memory plugs 30.

For example, during write operations, a point 1003c on the I-V curve 1003 depicts exemplary values for the half-select current $I_{HWrite}$ (i.e., $I_{HR}$ and $I_{HS}$) and half-select voltage $V_{HWrite}$ (i.e., $V_{HR}$ and $V_{HC}$) for half-selected memory plugs 30. The point 1003c is on a segment of the curve 1003 where the half-select current $I_{HWrite}$ and half-select voltage $V_{HWrite}$ do not enter into the region 901. That is, the magnitude of the half-select voltage $V_{HWrite}$ exceeds the minimum acceptable value denoted by line 905 and the half-select current $I_{HWrite}$ does not exceed the maximum acceptable value denoted by line 903. One skilled in the art will appreciate that the current $I_U$ for un-selected memory plugs 30 will be at or below the point 1003c assuming the non-select voltage potentials are equal or substantially equal during write operations. For example, the current $I_U$ may be substantially zero or may not fall on the curve 1003 as denoted by the region 1009 where the current through and the voltage across un-selected memory plugs 30 is substantially below that of the point 1003c.

As another example, a point 1003d on the curve 1003 depicts exemplary values for the write current $I_W$ and the write voltage $V_W$ for selected memory plug(s) 30' during a write operation. At the point 1003d, the magnitude of the write voltage $V_W$ does not fall below a minimum acceptable value denoted by line 915 and is greater than the read voltage $V_R$ denoted by line 715, and the write current $I_W$ does not exceed the maximum acceptable value denoted by line 913. One skilled in the art will understand that the minimum acceptable magnitude for the write voltage $V_W$ at the point 1003d takes into account that a portion of the write voltage $V_W$ drops across the threshold device 220 and that voltage drop (i.e., applied voltage bias) must be of sufficient magnitude to allow current to tunnel though the threshold device 220 as the write current $I_W$. As was mentioned above, the points 1003c and 1003d depict exemplary write operation I-V characteristics that satisfy the aforementioned goals of low power consumption for half-selected memory plugs 30, minimal or no power consumption for un-selected memory plugs 30, and a magnitude of the write voltage $V_W$ sufficient to write data (e.g., $R_0$ or $R_1$) to the selected memory plug 30' without causing write disturb in half-selected memory plugs 30.

Threshold Device Structure

A two-terminal cross-point memory array, single layer or vertically stacked layers, will have better performance if the threshold device 220 is implemented electrically in series with the memory element 200. Desired performance parameters include a high half-select ratio (HSR) such that a ratio of the current flowing through a selected memory plug 30' to the current flowing through half-selected memory plugs 30 is as large as possible. For example, a HSR of approximately 1000:1 or larger is preferable. More preferably, the HSR is approximately 4000:1 or larger. The larger the HSR, the lower the power dissipation caused by current flow in half-selected memory plugs 30, the greater the S/N ratio during read operations, and the lower the possibility for read or write disturbs to half-selected memory plugs 30. An exemplary threshold device 220 allows for significantly more conduction at higher voltages (e.g., read and write voltages) applied across the memory plug 30 than at low voltages (e.g., half-select and un-select voltages). The difference in conduction between high and low voltages can be observed on an I-V curve, where a steep slope in the I-V curve is indicative of significantly more conduction at higher applied voltages.

Careful selection of materials to create a layered dielectric stack including two or more layers of thin film dielectric materials that are in contact with one another can be used to obtain the desired electrical characteristics for the threshold device 220. At least one of the two or more layers is made from a different dielectric material than other layers in the stack. The stack may include one or more electrodes and the electrodes can be selected based on work function. For example, the stack can be sandwiched between a pair of metal electrodes and the electrodes may have different work functions. By layering materials of different barrier heights, faster electron transport can be obtained at higher applied voltages, either by lowering the barrier to electron transport, or by creating a quantum well that allows for fast resonant tunneling, for example.

Figure 11A:
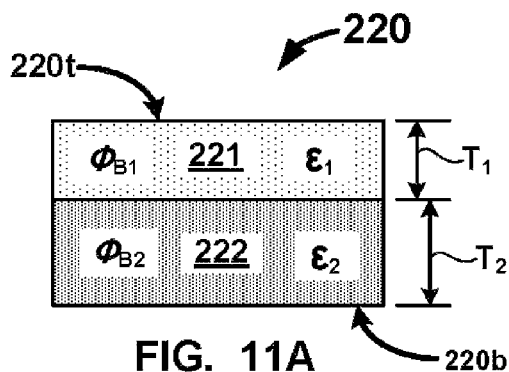
FIG. 11A depicts a first embodiment of a threshold device.

Turning now to FIG. 11A, an exemplary threshold device 220 includes a plurality of adjacent tunnel barriers 221 and 222 that are in contact with each other. At least one of the tunnel barriers is made from a material that is different than other of the plurality of adjacent tunnel barriers. Therefore, in the threshold device 220 depicted in FIG. 11A, the layers 221 and 222 are made from different materials. Each tunnel barrier is made from a dielectric material including a dielectric constant $\in$, a barrier height $\phi_B$, and a layer thickness T. Actual layer thickness will be application dependent and the thicknesses depicted are for purposes of explanation only. For example, tunnel barrier 221 includes a thickness $T_1$, a dielectric constant $\in_1$, and a barrier height $\phi_{B1}$ and tunnel barrier 222 includes a thickness $T_2$, a dielectric constant $\in_2$, and a barrier height $\phi_{B2}$. Although not depicted in FIG. 11A, the threshold device 220 may include electrodes in contact with the surfaces 220t and 220b (see 231 and 233 in FIG. 2D). As one example, parameters including but not limited to the selection of materials, dielectric constant $\in$, the number of adjacent tunnel barriers (i.e., two or more tunnel barriers), barrier height $\phi_B$, layer thickness, electrodes to the extent they are required, and electrode work function W, may be selected to contribute to the shape of I-V curve 1003 depicted in FIG. 10. Barrier height $\phi_B$ is not a physical property of any single material but rather the difference in electron affinity (chi or χ) between two semiconductor/insulators or between the electron affinity of a semiconductor/insulator and the work function of a juxtaposed metallic electrode. Assuming ideal behavior, the dielectric constants and barrier heights of the materials should be selected to complement each other. That is, they should be selected to maximize the barrier lowering effect. Accordingly, a careful selection of materials for each application will most greatly optimize the I-V characteristics. In regards to the above mentioned parameters, electron affinity, electronic band gap and dielectric constant are the three most important parameters for the semiconductor/insulator layers. On the other hand, if electrodes are used in the threshold device 220, then work function is the critical parameter for the electrodes. As was previously discussed, in that the threshold device 220 is electrically in series with the memory element 200; therefore, the I-V curve 1003 can be the result of the combined I-V characteristics of the threshold device 220 and the memory element 200.

Figure 11B:
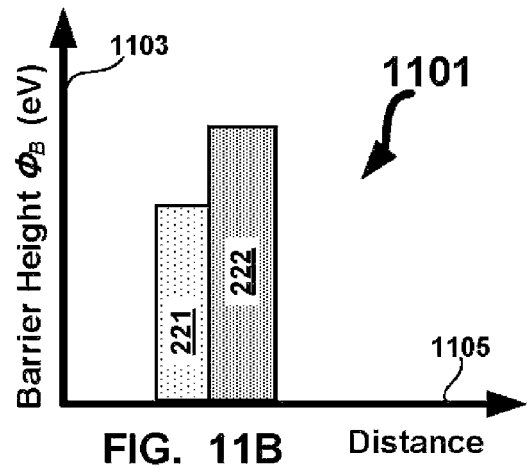
FIG. 11B depicts one embodiment of a graph of barrier height versus distance through the threshold device depicted in FIG. 11A.

Reference is now made to a graph 1101 in FIG. 11B, where the barrier to electron transport for each tunnel barrier (221, 222) at a particular point in the threshold device 220 is depicted as barrier height $\phi_B$ in electron volts eV on a Y-axis 1103 and a thickness of tunnel barriers (221, 222) is depicted as distance on a X-axis 1105. Typically, the distance axis 1105 is substantially perpendicular to the surfaces (220b, 220t) and an average direction of charge carriers (e.g., electrons or holes) tunneling through tunnel barriers (221, 222) is approximately parallel to the distance axis 1105. In the configuration depicted in FIG. 11B, the barrier height $\phi_{B1}$ and thickness $T_1$ of tunnel barrier 221 are less than the barrier height $\phi_{B2}$ and thickness $T_2$ of tunnel barrier 222. For example, assuming that the tunnel barriers (221, 222) are sandwiched between a pair of platinum (Pt) electrodes, tunnel barrier 221 may be a layer of $Ta_2O_5$ or $TiO_2$ with a thickness $T_2$ of approximately 9.0 Å and having a barrier height $\phi_{B1}$ of approximately 1.0 eV to 1.3 eV above the work function of Pt, and tunnel barrier 222 may be a layer of $Al_2O_3$ or $Gd_2O_3$ with a thickness $T_2$ of approximately 14.0 Å and having a barrier height $\phi_{B2}$ that is approximately 3.0 eV to 4.0 eV above the work function of Pt. Consequently, in FIG. 11B, assuming that charge carriers tunnel through tunnel barrier 221 with its lower barrier height $\phi_{B1}$ prior to tunneling through tunnel barrier 222 with its higher barrier height of $\phi_{B2}$.

Figure 11C:
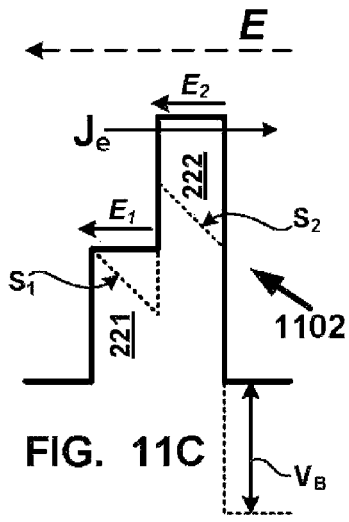
FIGS. 11C and 11D depict conduction band diagrams for opposite polarities of an applied voltage bias based on the graph of FIG. 11B.

Turning now to FIG. 11C, a conduction band diagram 1102 depicts band bending (see dashed lines) in each layer (221, 222) under an applied voltage bias $V_B$ across the threshold device 220 (e.g., a voltage drop across the threshold device 220 during data operations). The voltage bias $V_B$ results in an electric field E having a direction indicated by a dashed arrow and tunneling current depicted by a solid arrow for a current density $J_e$ having a direction opposite that of the electric field E. One skilled in the art will understand that if the entire memory plug 30 or a portion of the memory plug 30 (e.g., the threshold device 220) has a cross-sectional area 31A (see FIG. 2E), then the current density $J_e$ is proportional to the current flowing through the memory plug 30 during data operations. A slope ($S_1$, $S_2$) of the bent conduction band in each layer (221, 222) is indicative of the dielectric constant ∈ of that layer. The steeper the slope, the lower the dielectric constant ∈ and the greater the voltage drop across that layer. Each layer in the threshold device 220 introduces a voltage drop across that layer. Consequently, each layer has an electric field therein that is aligned with the electric field E. For example, layer 221 would have an electric field $E_1$ and layer 222 would have an electric field $E_2$. The introduction of additional layers (i.e., three or more layers) would result in an electric field in those layers as well.

Figure 11D:
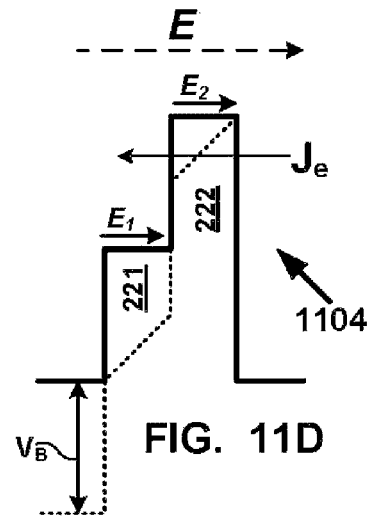
Figure 11F:
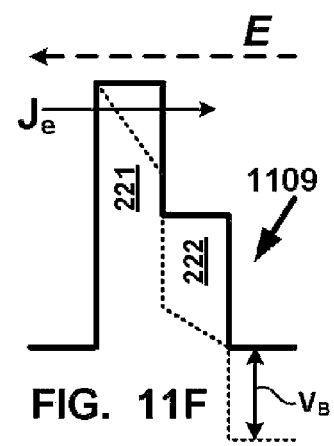
FIGS. 11F and 11G depict conduction band diagrams for opposite polarities of an applied voltage bias based on the graph of FIG. 11E.
Figure 11E:
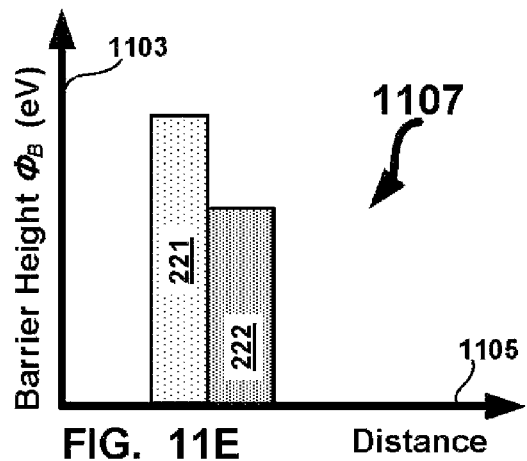
FIG. 11E depicts an alternative embodiment of a graph of barrier height versus distance through the threshold device depicted in FIG. 11A.
Figure 11G:
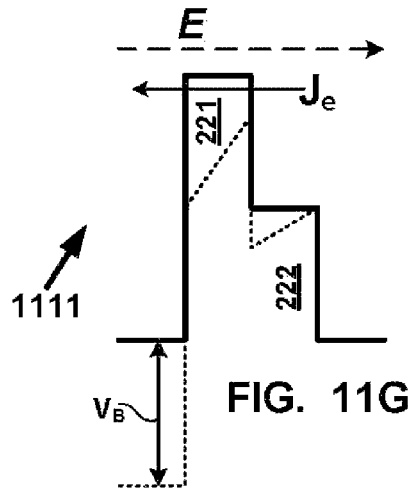

Referring now to FIG. 11D, a conduction band diagram 1104 depicts a voltage bias $V_B$ that is opposite that of diagram 1102 depicted in FIG. 11C, such that the directions of the electric field E and current density $J_e$ are reversed. Therefore, the threshold device 220 presents a different conduction band profile and different current tunneling characteristics depending in part on a magnitude and polarity of the voltage applied across memory plugs 30 during data operations. In FIG. 11E, a graph 1107 depicts a configuration of the threshold device 220 where the barrier height $\phi_{B1}$ of layer 221 is greater than the barrier height $\phi_{B2}$ of layer 222. FIGS. 11F and 11G depict the resulting conduction band diagrams (1109 and 1111) for opposite polarities of the applied voltage bias $V_B$. Consequently, the I-V characteristics of the threshold device 220 can be constructed so as to not cross into the regions 701, 711, 901, and 911 by carefully selecting the materials for the tunnel barrier layers, the barrier heights of the tunnel barrier layers, the number of tunnel barrier layers, the order in which the layers are arranged in the threshold device 220, the thicknesses of those layers, and the materials and work functions of the electrodes, if used, just to name a few.

Figure 12A:
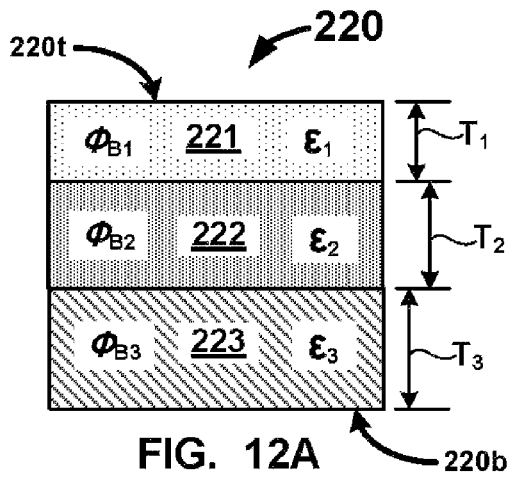
FIG. 12A depicts a second embodiment of a threshold device.
Figure 12B:
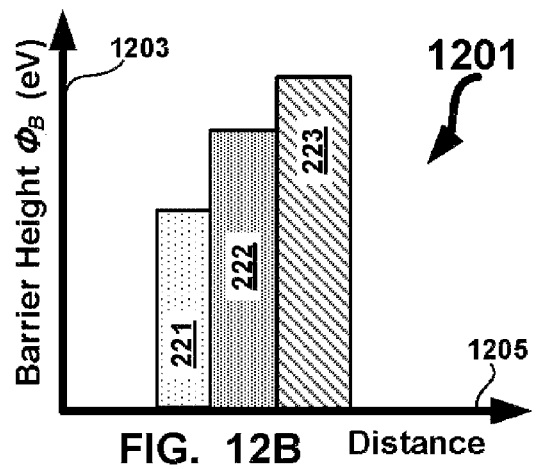
FIG. 12B depicts one embodiment of a graph of barrier height versus distance through the threshold device depicted in FIG. 12A.
Figure 12C:
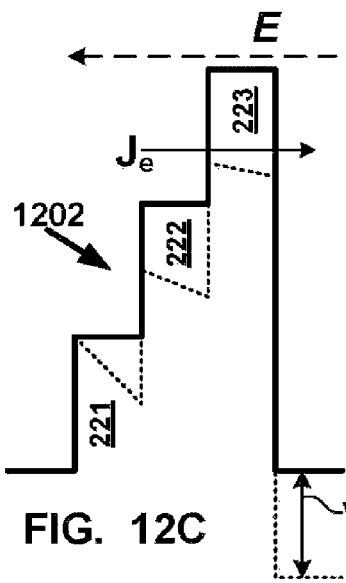
FIGS. 12C and 12D depict conduction band diagrams for opposite polarities of an applied voltage bias based on the graph of FIG. 12B.
Figure 12D:
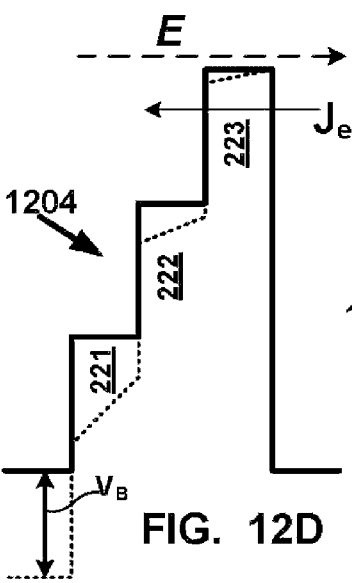

The threshold device 220 may include three or more tunnel barrier layers. As will be described in greater detail below, the three layer configuration can be used to implement crested and resonant tunnel barrier structures. In FIG. 12A, the threshold device 220 includes three layers 221, 222, and 223 having thicknesses $T_1$, $T_2$, $T_3$, dielectric constants $\in_1$, $\in_2$, $\in_3$, and barrier heights $\phi_{B1}$, $\phi_{B2}$, $\phi_{B3}$. At least one of the three layers is made from a different material than the other layers. Different materials can include materials having the same elemental composition (e.g., Al and O) but different stoichiometries. In FIG. 12B, a graph 1201 depicts an exemplary configuration in which barrier height $\phi_B$ increases from left to right for layers 221, 222, and 223. FIGS. 12C and 12D depict exemplary conduction band diagrams (1202 and 1204) for opposite polarities of applied voltage bias $V_B$ for the configuration of FIG. 12B.

Figure 12F:
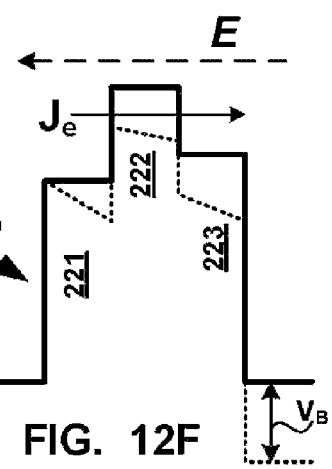
FIGS. 12F and 12G depict conduction band diagrams for opposite polarities of an applied voltage bias based on the graph of FIG. 12E.
Figure 12E:
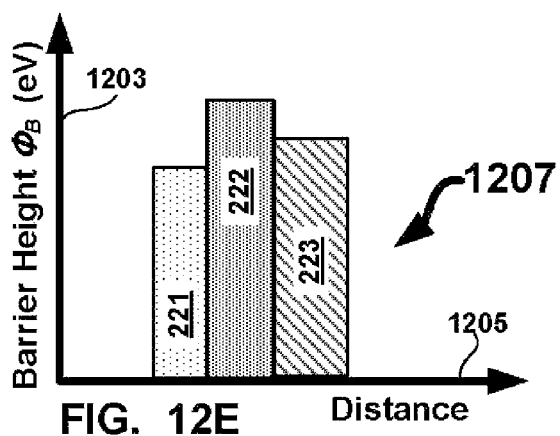
FIG. 12E depicts an alternative embodiment of a graph of barrier height versus distance through the threshold device depicted in FIG. 12A.
Figure 12G:
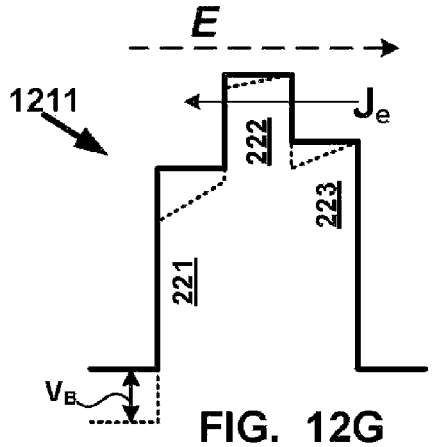

In FIG. 12E, a graph 1207 depicts another exemplary configuration in which the layer 222 has the highest barrier height and the third layer 223 has a barrier height that is greater than that of the first layer 221 but is less than that of the second layer 222. FIGS. 12F and 12G depict exemplary conduction band diagrams (1209 and 1211) for the configuration of FIG. 12E.

The barrier height graphs depicted in FIGS. 11B, 11E, 12B, and 12E, present different conduction band profiles and tunneling characteristics depending on the magnitude and polarity of the applied voltage bias $V_B$. The differences in conduction band profiles and tunneling characteristics may be desirable for some applications. For example, in applications where it is not necessary for the threshold device 220 to have approximately symmetric I-V characteristic for both polarities of the applied voltage bias $V_B$. As another example, the read voltage $V_R$ may be applied with only one polarity such as a positive voltage potential on the first terminal 11 and a negative voltage potential on the second terminal 12 of the selected memory plug 30'. The conduction band profile and tunneling characteristics can be selected to allow a sufficient read current $I_R$ to flow through the selected memory plug 30' given the magnitude and polarity of the read voltage $V_R$. As another example, the material and physical properties of the layers in the threshold device can be selected so that barrier height $\phi_B$ increases or decreases monotonically in a predetermined direction (i.e., a direction that current tunnels flows through the threshold device 220). However, applying the read voltage $V_R$ with the same magnitude but opposite polarity may result in sufficient read current $I_R$ flow in the preferred direction and insufficient read current flow in a direction opposite the preferred direction. Moreover, even though the conduction band profiles and tunneling characteristics may be polarity sensitive for read operations, the same may not be true for write operations, where the magnitude of the write voltage $V_W$ is typically greater than the magnitude of the read voltage $V_R$. Therefore, non-symmetrical conduction band profiles and tunneling characteristics may be acceptable so long as the magnitude and polarities of the write voltage $V_W$ are sufficient to effectuate the writing of a "0" or a "1" to the selected memory plug 30'. However, in some applications, non-symmetrical conduction band profiles and tunneling characteristics may result in I-V characteristics that enter into the regions 701, 711, 901, and 911 depending on the polarity of the voltage across the threshold device 220.

In some applications, it may be desirable for the threshold device 220 to have approximately symmetric I-V characteristic for both polarities of the applied voltage bias $V_B$. For example, it may be desirable to alternate a polarity of the read voltage $V_R$ so that over a course of several read operations to the array 100, the read voltage $V_R$ has a first polarity for some read operations and a second polarity that is opposite the first polarity for other read operations. Circuitry coupled with the array 100 (e.g., address unit 103 in FIG. 1) can be used to alternate the polarity of the read voltage $V_R$. As one example, the circuitry can be operative to effectuate approximately half of the read operations at the first polarity and approximately half of the read operations at the second polarity.

The application of opposite polarity voltages for write and/or read operations can be used to determine the structure of the threshold device 220. For example, a symmetric threshold device 220 can be configured to allow for approximately similar or substantially similar conduction band profiles and tunneling characteristics for opposite polarities of the applied bias voltage $V_B$ during read (i.e., $\pm V_R$) and write (i.e., $\pm V_W$) operations. As was described above, the opposite polarity voltages can be applied as voltage pulses. An additional advantage to approximately symmetric I-V characteristic for both polarities of the applied voltage bias $V_B$ is that the curve 1003 stays outside the regions 701, 711, 901, and 911 regardless of the direction current is passed through the threshold device 220.

Crested Tunnel Barrier Structure

Figure 13A:
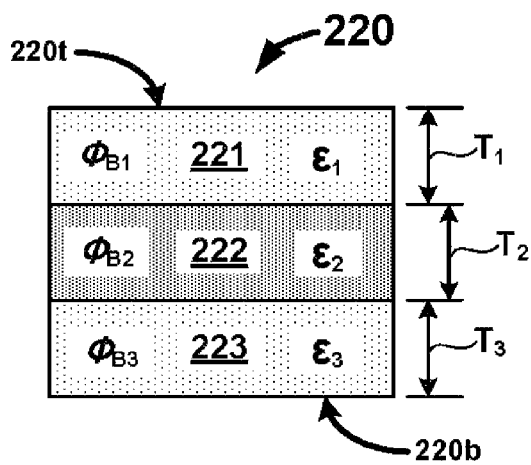
FIG. 13A depicts one embodiment of a threshold device having a crested tunnel barrier structure.

Reference is now made to FIG. 13A, where an exemplary threshold device 220 includes three layers 221, 222, and 223 having thicknesses $T_1$, $T_2$, $T_3$, dielectric constants $\in_1$, $\in_2$, $\in_3$, and barrier heights $\phi_{B1}$, $\phi_{B2}$, $\phi_{B3}$. Preferably, the outer layers 221 and 223 are made from the same material and the inner layer 222 is made from a different material than the outer layers. For example, the outer layers 221 and 223 can be made from silicon nitride ($SiN_x$) and the inner layer 222 from hafnium oxide ($HfO_2$) to form a $SiN_x/HfO_2/SiN_x$ heterostructure. One benefit of this three layer heterostructure is that it provides the I-V symmetry necessary for the threshold device 220 to operate in a bipolar mode, that is, the threshold device 220 has substantially similar I-V characteristics for both polarities of applied voltage $V_B$. Preferably, the materials to be used for the layers are small band gap, low k, large electron affinity materials for the outer layers and large band gap, high k, small electron affinity materials for the inner layer. Layer thicknesses should be thin to have a high enough current through the threshold device 220 (e.g., thickness on the order of approximately 10 Å per layer). The exact thicknesses would depend on the materials parameters. Preferably, the outer layers 221 and 223 have thicknesses that are substantially equal to each other (i.e., $T_1 \approx T_3$) to obtain substantially similar conduction band profiles and tunneling characteristics for opposite polarities of the applied bias voltage $V_B$.

Figure 13B:
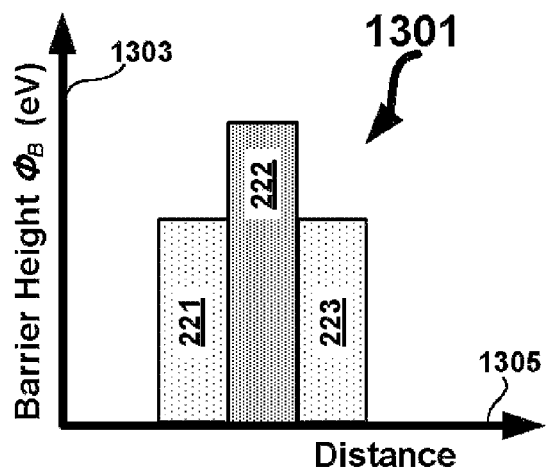
FIG. 13B depicts a graph of barrier height versus distance through the threshold device depicted in FIG. 13A.
Figure 13C:
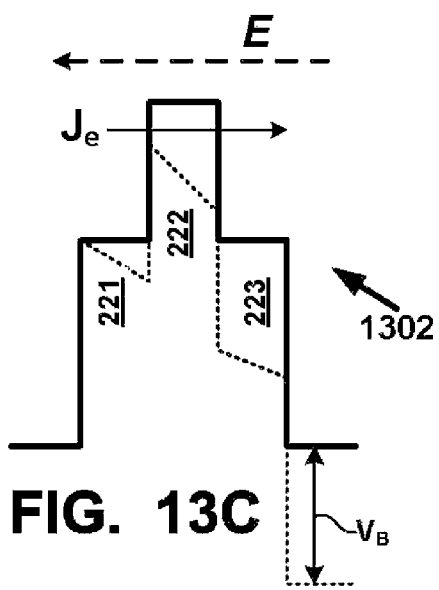
FIGS. 13C and 13D depict conduction band diagrams for opposite polarities of an applied voltage bias based on the graph of FIG. 13B.
Figure 13D:
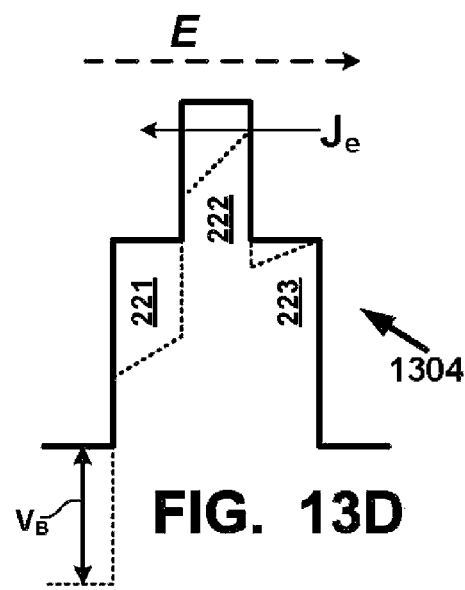

Reference is now made to FIG. 13B, where graph 1301 depicts barrier height versus distance for a crested tunnel barrier structure. The outer layers 221 and 223 have barrier heights $\phi_{B1}$ and $\phi_{B3}$ that are substantially equal to each other (i.e., $\phi_{B1} \approx \phi_{B3}$) and dielectric constants that are substantially equal to each other (i.e., $\in_1 \approx \in_3$). The inner layer 222 has a barrier height $\phi_{B2}$ that is greater than the barrier height of the outer layers (i.e., $\phi_{B2} > \phi_{B1}, \phi_{B3}$) and has a different dielectric constant $\in_2$. The resulting crested tunnel barrier structure for the threshold device 220 is operative to provide substantially similar conduction band profiles and tunneling characteristics for both polarities of the applied voltage bias $V_B$. FIGS. 13C and 13D depict the exemplary conduction band diagrams (1302 and 1304) that are substantially symmetric for opposite polarities of the applied voltage bias $V_B$. One advantage to the tri-layered heterostructure depicted in FIGS. 13A and 13B is that electron transport is magnified at higher magnitudes of the applied bias voltage $V_B$ of either polarity. Due to the voltage drop across the lower barrier height layers, the overall heterostructure barrier height becomes lower at higher voltages. This allows for greater electron transport, resulting in steeper I-V curves and the ability to achieve the exemplary I-V curve 1003 depicted in FIG. 10.

Resonant Tunnel Barrier Structure

Figure 14A:
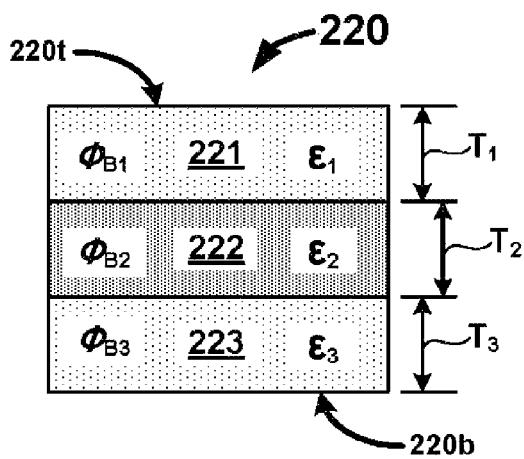
FIG. 14A depicts one embodiment of a threshold device having a resonant tunnel barrier structure.

Turning to FIG. 14A, an exemplary threshold device 220 includes three layers 221, 222, and 223 having thicknesses $T_1$, $T_2$, $T_3$, dielectric constants $\in_1$, $\in_2$, $\in_3$, and barrier heights $\phi_{B1}$, $\phi_{B2}$, $\phi_{B3}$. Preferably, the outer layers 221 and 223 are made from the same material and the inner layer 222 is made from a different material than the outer layers. For example, the outer layers 221 and 223 can be made from aluminum oxide ($Al_2O_3$) and the inner layer 222 from hafnium oxide ($HfO_2$) to form a $Al_2O_3/HfO_2/Al_2O_3$ heterostructure. In the $Al_2O_3/HfO_2/Al_2O_3$ heterostructure, the $Al_2O_3$ has the higher barrier height and forms the outside layers and the $HfO_2$ forms the inside layer of the resonant tunnel barrier structure. Furthermore, it is preferable that the outer layers 221 and 223 have thicknesses that are substantially equal to each other (i.e., $T_1 \approx T_3$) to obtain substantially similar conduction band profiles and tunneling characteristics for both polarities of the applied bias voltage $V_B$. That is, ideally the quantum well produced by the resonant tunneling structure has symmetric characteristics for both polarities of the applied voltage $V_B$ and allows for faster electron transport and steeper characteristic I-V curves.

Figure 14B:
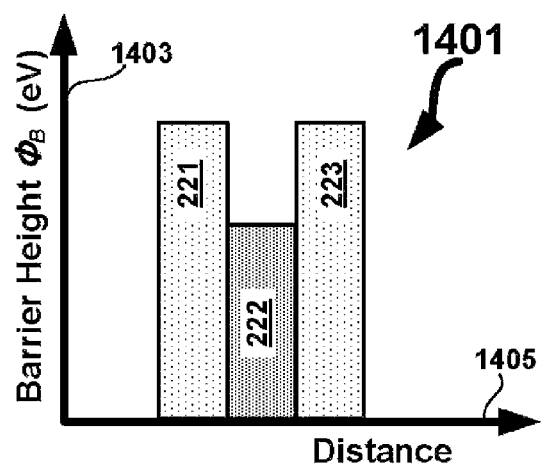
FIG. 14B depicts a graph of barrier height versus distance through the threshold device depicted in FIG. 14A FIGS. 14C and 14D depict conduction band diagrams for opposite polarities of an applied voltage bias based on the graph of FIG. 14B.
Figure 14C:
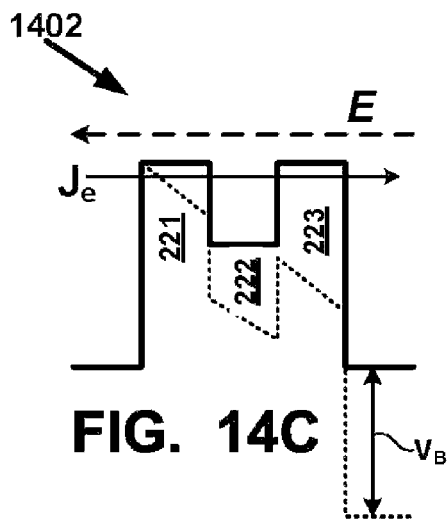
Figure 14D:
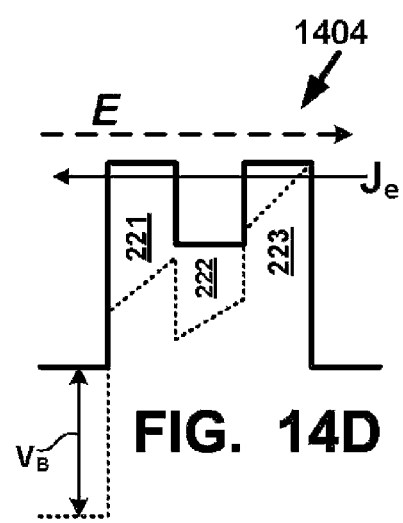

Reference is now made to FIG. 14B, where graph 1401 depicts barrier height versus distance for a resonant tunnel barrier structure. The outer layers 221 and 223 have barrier heights $\phi_{B1}$ and $\phi_{B3}$ that are substantially equal to each other (i.e., $\phi_{B1} \phi_{B3}$) and dielectric constants that are substantially equal to each other (i.e., $\in_1 \approx \in_3$). The inner layer 222 has a barrier height $\phi_{B2}$ that is less than the barrier height of the outer layers (i.e., $\phi_{B2} < \phi_{B1}, \phi_{B3}$) and has a different dielectric constant $\in_2$. The resulting resonant tunnel barrier structure for the threshold device 220 is operative to provide substantially similar conduction band profiles and tunneling characteristics for both polarities of the applied voltage bias $V_B$. FIGS. 14C and 14D depict the exemplary conduction band diagrams (1402 and 1404) that are substantially symmetric for opposite polarities of the applied voltage bias $V_B$.

Multi-Layer Heterostructures

Figure 15A:
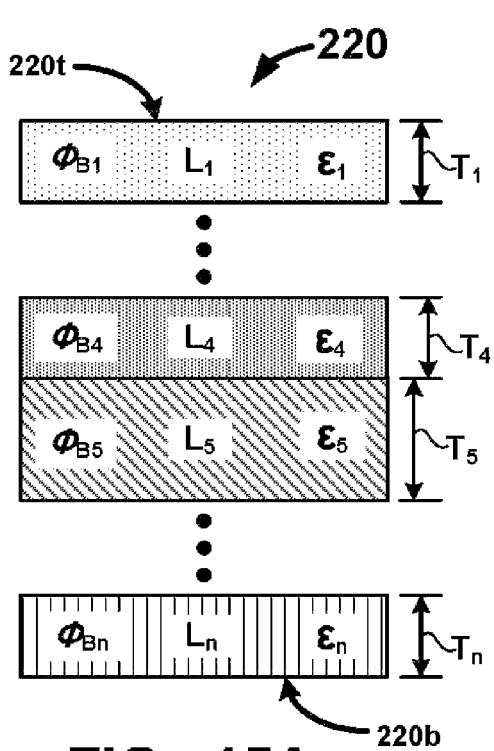
FIG. 15A depicts one embodiment of a threshold device including n tunnel barrier layers.
Figure 15B:
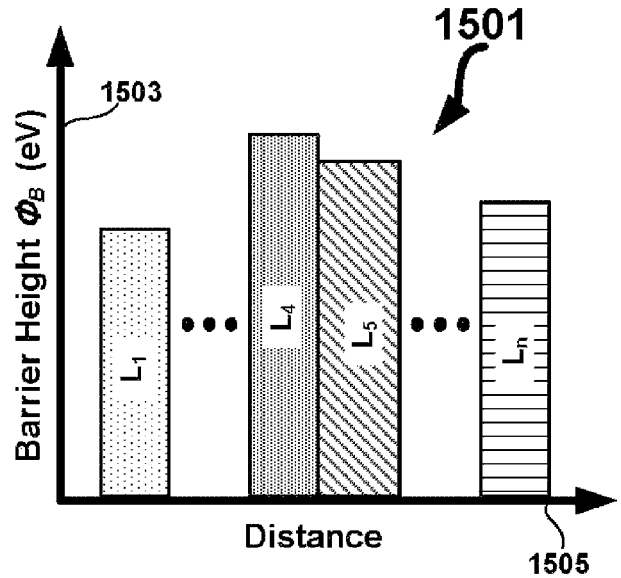
FIG. 15B depicts a graph of barrier height versus distance through the threshold device depicted in FIG. 15A.

Although the previous drawings have depicted two and three layer heterostructures, the threshold device 220 can include more than three tunnel barrier layers. Turning now to FIG. 15A, the threshold device 220 includes n tunnel barrier layers denoted as $L_1$ through $L_n$, where $n \geq 2$. At least one of the layers is made from a material that is different than other of the layers. The layers include barrier heights $\phi_{B1}$ through $\phi_{Bn}$, dielectric constants $\in_1$ through $\in_n$, and layer thicknesses $T_1$ through $T_n$. In FIG. 15B, a graph 1501 depicts barrier height versus distance for the threshold device 220. The conduction band profiles and tunneling characteristics for the threshold device 220 can be tailored to a specific application by selection of the number of layers, the materials for the layers, the dielectric constants of the layers, and the thickness of each layer, for example. If one or more electrodes are required, the material and its work function can be selected to meet the application specific design goals for the threshold device 220. The resulting conduction band diagrams (not shown) for the threshold device 220 will be determined in part by the aforementioned selection of materials and their properties. As one example, the n layers can be formed by continually grading a material using pulsed laser deposition to create many individual layers of different composition.

Although the barrier heights $\phi_B$ in FIGS. 11B, 11E, 12B, 12E, 13B, 14B, and 15B are depicted as rectangular in shape for purposes of explanation, the actual shape may not be rectangular. For example, at an interface between adjacent tunnel barrier layers or between an electrode and a tunnel barrier layer, there may be some intermixing of materials from each layer that results in a transition between materials that is not as abrupt as depicted in FIGS. 11B, 11E, 12B, 12E, 13B, 14B, and 15B.

Figure 16A:
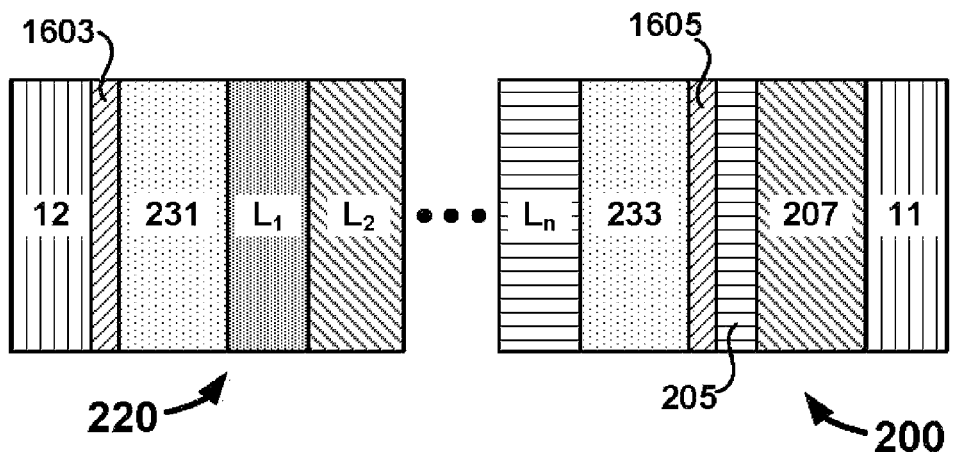
FIG. 16A is a cross-sectional view depicting a memory plug including an n layer threshold device sandwiched between a pair of electrodes, where $n \geq 2$.

Reference is now made to FIG. 16A, where memory plug 30 includes the threshold device 220 electrically in series with the memory element 200 and with the first and second terminals 11 and 12. The threshold device includes at least two tunnel barrier layers $L_1$ and $L_2$, and optionally, additional tunnel barrier layers up to layer $L_n$. The threshold device 220 includes the optional electrode layers 231 and 233 that sandwich the tunnel barrier layers to form a metal-insulator-metal (MIM) structure. The electrodes 231 and 233 are optional and one or both electrodes may be eliminated if the layers of materials in the memory plug 30 are compatible with the materials used for the tunnel barrier layers in the threshold device 220. Accordingly, when one or both electrode are eliminated, the threshold device 220 can be implemented as a non-MIM structure. Additionally, the memory plug 30 may include layers 1603 and 1605 that can serve as glue layers, adhesion layers, buffer layers, anti-reflection layers, or the like, for example. The layers 1603 and 1605 can be used to effectuate a stable mechanical and electrical connection between adjacent layers, such as between the terminal 12 and the electrode 231, or between the electrode 233 and layer 205 of the memory element 200.

Threshold Device Fabrication

The thin film layers of material that comprise the tunnel barrier layers can be fabricated using processes that are well understood in the microelectronics art. For example, processes including but not limited to atomic layer deposition (ALD), chemical vapor deposition (CVD), sputtering, molecular beam epitaxy (MBE), spin on deposition, pulsed laser deposition, electron-beam (e-beam) deposition, and thermal evaporation can be used to deposit the tunnel barrier layers. The electrodes can be deposited using sputtering, for example. Typically, layer thickness for a tunnel barrier layer will be approximately 100 Å or less. More preferably, the layer thickness is approximately 50 Å or less. For example, the tunnel barrier layers can have thickness from about 5.0 Å to about 35 Å. There are a wide variety of materials that may be selected for the tunnel barrier layers. Examples of suitable materials for the tunnel barrier layers include but are not limited to $SiO_2$, $Al_2O_3$, $SiN_X$, $HfSiO_X$, $ZrSiO_X$, $Y_2O_3$, $Gd_2O_3$, $LaAlO_3$, $HfO_2$, $ZrO_2$, $Ta_2O_5$, $TiO_X$, yttria-stabilized zirconia (YSZ), $Cr_2O_3$, and $BaZrO_3$. A wave function of a charge carrier tunneling through a tunnel barrier layer is dependent in part on the dielectric constant, the thickness, and the barrier height of the tunnel barrier layer. Furthermore, the greater the thickness of the tunnel barrier layer, the fewer the number of charge carriers that can tunnel through the layer. Consequently, if electrodes are used, the choice of materials for the tunnel barrier layers depends in part on the offset of the barrier height from the conduction band of the electrodes, the work function of the electrodes, and the dielectric constants and thicknesses of the tunnel barrier layers.

Although the above description has used a memory element 200 as an example, uses for the threshold device 220 are not limited to the examples described herein and the threshold device 220 can be used in a variety of electronic applications where it is necessary to control current flow through a circuit as a function of voltage. Therefore, the threshold device 220 can be used with a device that is electrically in series with the threshold device 220 and that requires that the current through the device be controlled over a range of applied voltages across the device. As one example, the device in series with the threshold device 220 may be another type of memory technology in which stored data in the device can be determined by the application of a read voltage and the state of the stored data can be changed by applying a write voltage. In either case, the threshold device 220 can be used to reduce power dissipation in half-selected and/or un-selected devices during data operations, to prevent read or write disturbs to half-selected devices, to increase the half-select ratio during data operations, and to increase S/N ratio during read operations, particularly when the state of the stored data is sensed as a magnitude of a read current that flows through a selected device. The device may be one of a plurality of identical devices configured into a two-terminal cross-point memory array.

Conclusion

Although several embodiments of an apparatus and a method of the present invention have been disclosed and illustrated herein, the invention is not limited to the specific forms or arrangements of parts so described and illustrated. The invention is only limited by the claims.

What is claimed is:

1. A re-writeable non-volatile memory device, comprising:
   a two-terminal memory cell including a first terminal, a second terminal, and electrically in series with the first and second terminals
   a threshold device including a plurality of tunnel barrier layers that are in contact with one another, each tunnel barrier layer is made from a dielectric material having a thickness configured for electron tunneling only when voltages for data operations are applied across the first and second terminals of the memory cell, one of the plurality of tunnel barrier layers is in contact with a first electrode that is electrically coupled with the first terminal, and another one of the plurality of tunnel barrier layers is in contact with a second electrode,
   a two-terminal re-writeable non-volatile memory element including a conductive metal oxide (CMO) layer that includes mobile oxygen ions, and an electrolytic tunnel barrier in contact with the CMO layer and made from a material that is an ionic conductor permeable to the mobile oxygen ions during write operations to the memory cell and is an electronic insulator configured for electron tunneling during the data operations, the electrolytic tunnel barrier having a thickness of less than 50 Angstroms, the memory element is in contact with a third electrode and electrically coupled with the second electrode,
   the memory element configured to store at least one-bit of non-volatile data as a plurality of conductivity profiles that are retained in the absence of electrical power, are non-destructively read by applying a read voltage across the first and second terminals, and are reversibly written by applying a write voltage across the first and second terminals, and
   the memory element including a non-linear I-V characteristic for all values of the plurality of conductivity profiles.

2. The memory device of claim 1, wherein the plurality of tunnel barrier layers comprises exactly two tunnel barrier layers that are made from different dielectric materials.

3. The memory device of claim 1, wherein the plurality of tunnel barrier layers comprises exactly three tunnel barrier layers and at least one of the three tunnel barrier layers is made from a different dielectric material.

4. The memory device of claim 3, wherein the three tunnel barrier layers are configured to implement a crested tunnel barrier structure.

5. The memory device of claim 3, wherein the three tunnel barrier layers are configured to implement a resonant tunnel barrier structure.

6. The memory device of claim 1, wherein the plurality of tunnel barrier layers have a combined thickness that is less than 100 Angstroms.

7. The memory device of claim 1, wherein at least one of the plurality of tunnel barrier layers comprises a low-k dielectric material.

8. The memory device of claim 1, wherein at least one of the plurality of tunnel barrier layers comprises a high-k dielectric material.

9. The memory device of claim 1, wherein at least one of the plurality of tunnel barrier layers comprises a high-k dielectric material and at least another one of the plurality of tunnel barrier layers comprises a low-k dielectric material.

10. The memory device of claim 1, wherein for voltages applied across the first and second terminals having a magnitude of a half-select voltage or less, the threshold device is configured to limit current flow through the memory cell to either no current flow or substantially no current flow.

11. The memory device of claim 1, wherein the threshold device has a position in the memory cell that is above the memory element.

12. The memory device of claim 1, wherein the threshold device has a position in the memory cell that is below the memory element.

13. The memory device of claim 1, wherein the memory element is in contact with the second electrode.

14. The memory device of claim 13, wherein the CMO is in contact with the second electrode.

15. The memory device of claim 13, wherein the electrolytic tunnel barrier is in contact with the second electrode.

16. The memory device of claim 1 and further comprising:
a fourth electrode in contact with the memory element and electrically coupled with the second electrode.

17. The memory device of claim 16, wherein the CMO is in contact with the fourth electrode.

18. The memory device of claim 16, wherein the electrolytic tunnel barrier is in contact with the fourth electrode.

19. The memory device of claim 1, wherein voltages for data operations that are applied across the first and second terminals are uni-polar or bi-polar.

20. The memory device of claim 1, wherein a write operation to the memory cell does not require a prior erase operation.

21. The memory device of claim 1, wherein one or more of the plurality of tunnel barrier layers comprises an atomic layer deposition (ALD) deposited layer of dielectric material.

22. The memory device of claim 1, wherein the electrolytic tunnel barrier comprises an atomic layer deposition (ALD) deposited layer.

23. The memory device of claim 1, wherein the CMO comprises a mixed ionic electronic conductor and the plurality of conductivity profiles are determined by a concentration of the mobile oxygen ions present in the CMO.

24. An integrated circuit, comprising:
a silicon substrate including active circuitry fabricated on the silicon substrate and at least a portion of the active circuitry is configured for data operations on at least one layer of vertically stacked non-volatile memory that is in contact with and is fabricated directly above the silicon substrate, the at least one layer of vertically stacked non-volatile memory including
at least one two-terminal cross-point memory array embedded therein and including a plurality of first and second conductive array lines that are arranged orthogonally to each other; and
a plurality of two-terminal memory cells, each memory cell including a first terminal and a second terminal, each memory cell is positioned between a cross-point of a unique pair of the plurality of first and second conductive array lines and is electrically in series with its unique pair of conductive array lines, each memory cell including electrically in series with the first and second terminals
a threshold device including a plurality of tunnel barrier layers that are in contact with one another, each tunnel barrier layer is made from a dielectric material having a thickness configured for electron tunneling only when voltages for data operations are applied across the first and second terminals of the memory cell, one of the plurality of tunnel barrier layers is in contact with a first electrode that is electrically coupled with the first terminal, and another one of the plurality of tunnel barrier layers is in contact with a second electrode, and at least one of the plurality of tunnel barrier layers is made from a different dielectric material than other ones of the plurality of tunnel barrier layers,
a two-terminal re-writeable non-volatile memory element including a conductive metal oxide (CMO) layer that includes mobile oxygen ions, and an electrolytic tunnel barrier in contact with the CMO layer and made from a material that is an ionic conductor permeable to the mobile oxygen ions during write operations to the memory cell and is an electronic insulator configured for electron tunneling during the data operations, the electrolytic tunnel barrier having a thickness of less than 50 Angstroms, the memory element is in contact with a third electrode and electrically coupled with the second electrode,
the memory element configured to store at least one-bit of non-volatile data as a plurality of conductivity profiles that are retained in the absence of electrical power, are non-destructively read by applying a read voltage across the first and second terminals, and are reversibly written by applying a write voltage across the first and second terminals, and
the memory element including a non-linear I-V characteristic for all values of the plurality of conductivity profiles.

25. The integrated circuit of claim 24, wherein one or more of the plurality of tunnel barrier layers comprises an atomic layer deposition (ALD) deposited layer of dielectric material.

26. The integrated circuit of claim 24, wherein the electrolytic tunnel barrier comprises an atomic layer deposition (ALD) deposited layer.

27. The integrated circuit of claim 24, wherein the CMO comprises a mixed ionic electronic conductor and the plurality of conductivity profiles are determined by a concentration of the mobile oxygen ions present in the CMO.

* * * * *